(12) United States Patent
Takizawa

(10) Patent No.: US 9,761,462 B2
(45) Date of Patent: Sep. 12, 2017

(54) RESIN PACKAGE WITH A GROOVE FOR AN EMBEDDED INTERNAL LEAD

(71) Applicant: FUJI ELECTRIC CO., LTD., Kawasaki-shi, Kanagawa (JP)

(72) Inventor: Naoki Takizawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/940,823

(22) Filed: Nov. 13, 2015

(65) Prior Publication Data
US 2016/0155687 A1 Jun. 2, 2016

(30) Foreign Application Priority Data

Dec. 2, 2014 (JP) .................................. 2014-243588

(51) Int. Cl.
| | |
|---|---|
| *H01L 23/48* | (2006.01) |
| *H05K 5/02* | (2006.01) |
| *H01L 21/00* | (2006.01) |
| *H01L 21/48* | (2006.01) |
| *H01L 23/053* | (2006.01) |
| *H01L 23/373* | (2006.01) |
| *H01L 23/498* | (2006.01) |
| *H01L 23/31* | (2006.01) |
| *H01L 23/00* | (2006.01) |

(52) U.S. Cl.
CPC ........ *H01L 21/4842* (2013.01); *H01L 23/053* (2013.01); *H01L 23/3735* (2013.01); *H01L 23/49861* (2013.01); *H01L 23/3107* (2013.01); *H01L 24/29* (2013.01); *H01L 24/32* (2013.01); *H01L 24/48* (2013.01); *H01L 24/73* (2013.01); *H01L 2224/291* (2013.01); *H01L 2224/32225* (2013.01); *H01L 2224/48091* (2013.01); *H01L 2224/48137* (2013.01); *H01L 2224/48227* (2013.01); *H01L 2224/48247* (2013.01); *H01L 2224/73265* (2013.01); *H01L 2924/00014* (2013.01); *H01L 2924/181* (2013.01); *H01L 2924/19107* (2013.01)

(58) Field of Classification Search
CPC ........... H01L 23/49861; H01L 23/3735; H01L 23/053; H01L 21/565; H01L 21/4842; H01L 23/49548; H01L 23/49562; H01L 23/3114; H01L 23/3107
See application file for complete search history.

(56) References Cited

U.S. PATENT DOCUMENTS

| | | | | |
|---|---|---|---|---|
| 6,060,772 A | * | 5/2000 | Sugawara | ............. H01L 25/162 257/678 |
| 6,914,321 B2 | * | 7/2005 | Shinohara | ........... H01L 23/4334 257/502 |

(Continued)

FOREIGN PATENT DOCUMENTS

JP 2000-332179 A 11/2000

*Primary Examiner* — Alonzo Chambliss
(74) *Attorney, Agent, or Firm* — Manabu Kanesaka

(57) ABSTRACT

A semiconductor device includes an external lead-out terminal having an external terminal and an internal terminal connected to a connecting portion of the external terminal. By forming a resin fixed portion linked to a horizontal resin portion in the vicinity of a leading end of the internal terminal, a gap under the internal terminal when cutting the terminal coupling portion off from the internal terminal can be restricted.

8 Claims, 23 Drawing Sheets

(56) References Cited

U.S. PATENT DOCUMENTS

| | | | | |
|---|---|---|---|---|
| 7,709,947 B2* | 5/2010 | Ishikawa | ................ | H01L 24/49 |
| | | | | 257/666 |
| 8,441,117 B2* | 5/2013 | Soyano | ................ | H01L 23/04 |
| | | | | 257/693 |
| 2009/0096081 A1* | 4/2009 | Soyano | ................ | H05K 7/1432 |
| | | | | 257/698 |

* cited by examiner

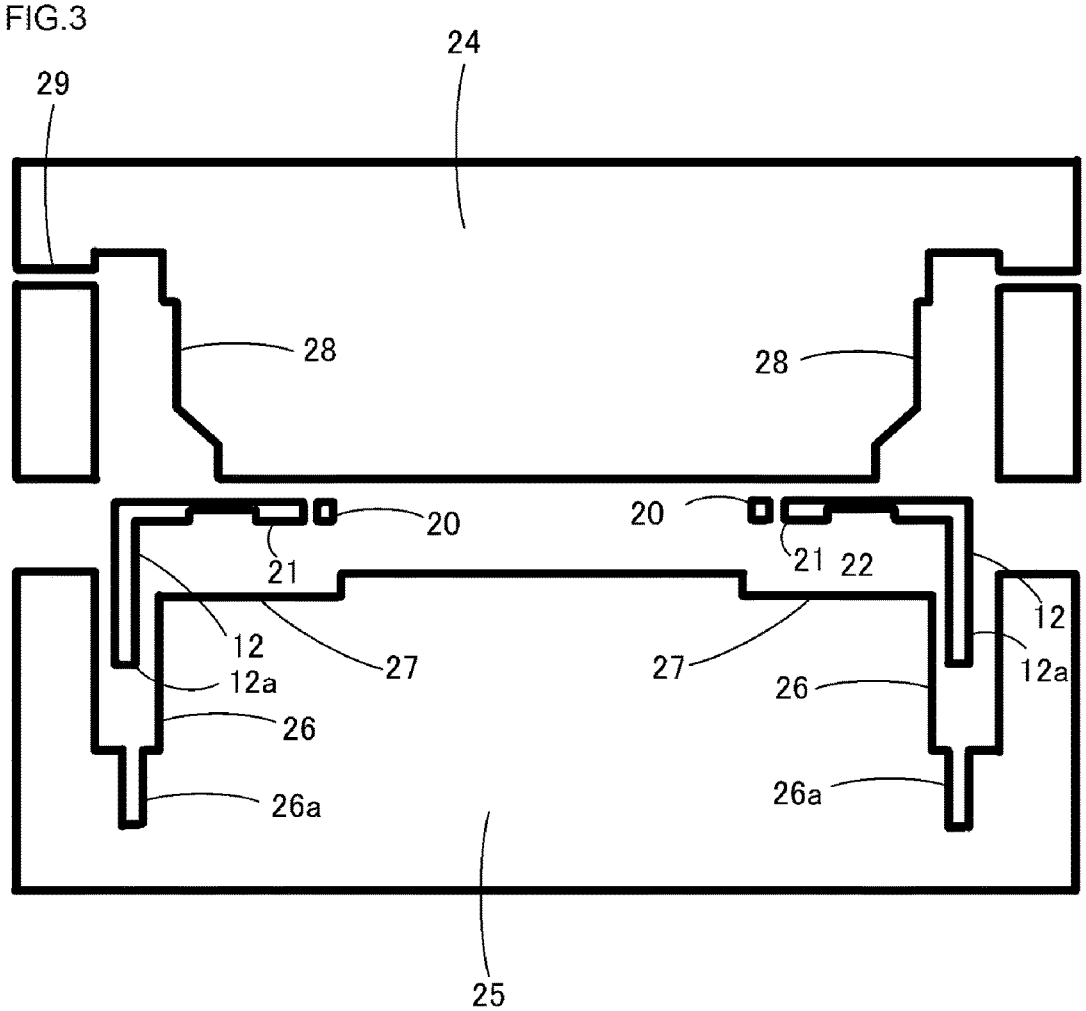

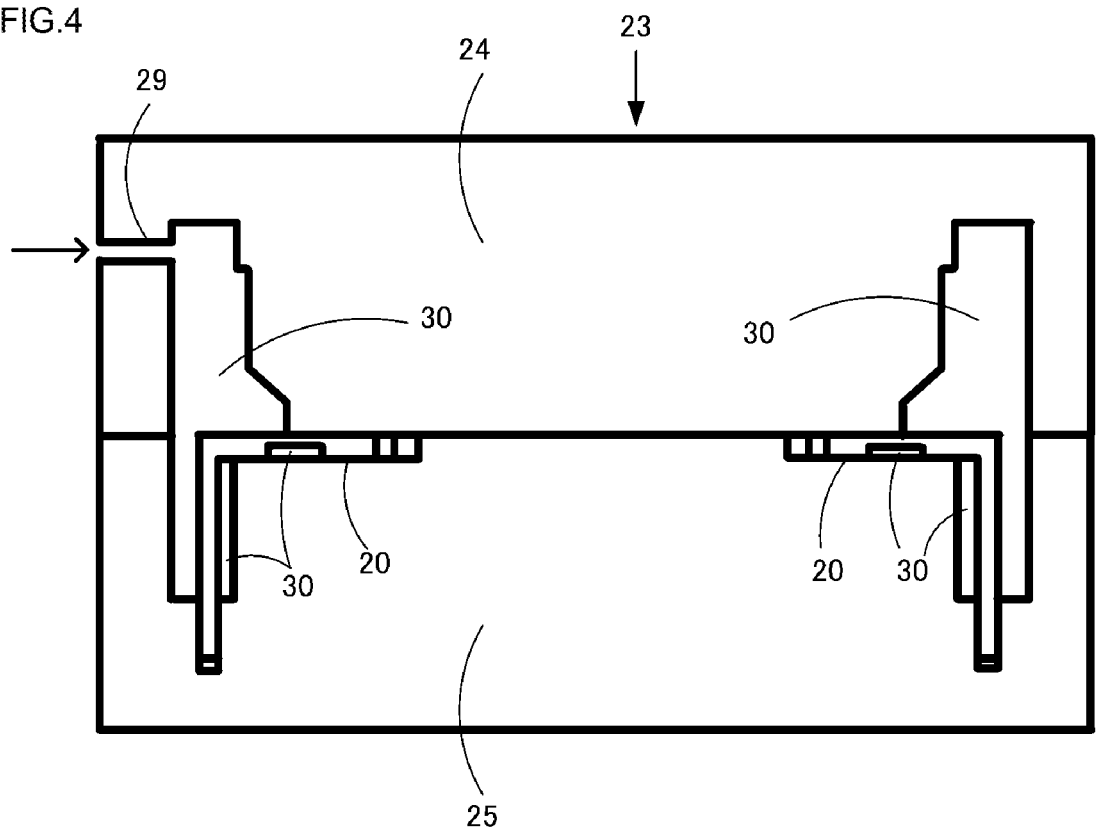

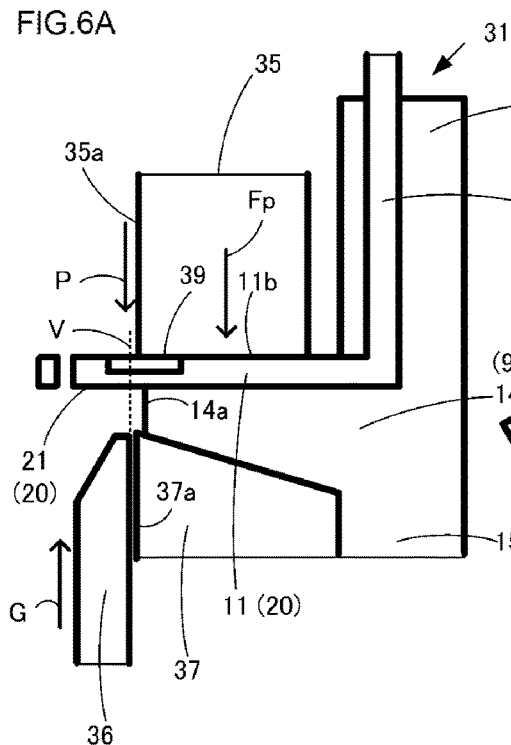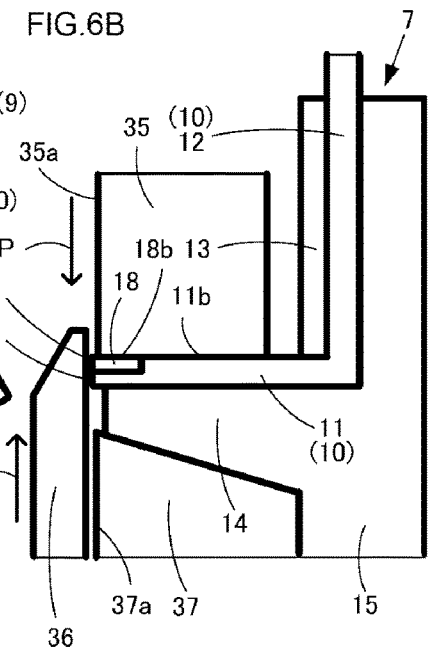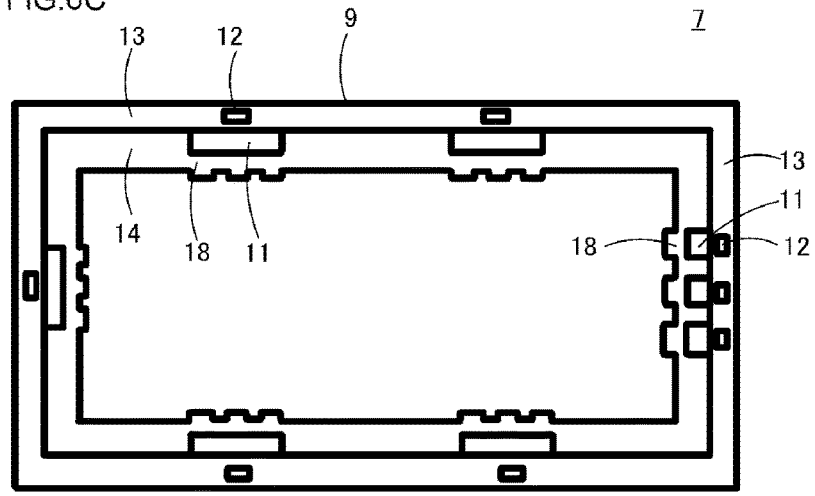

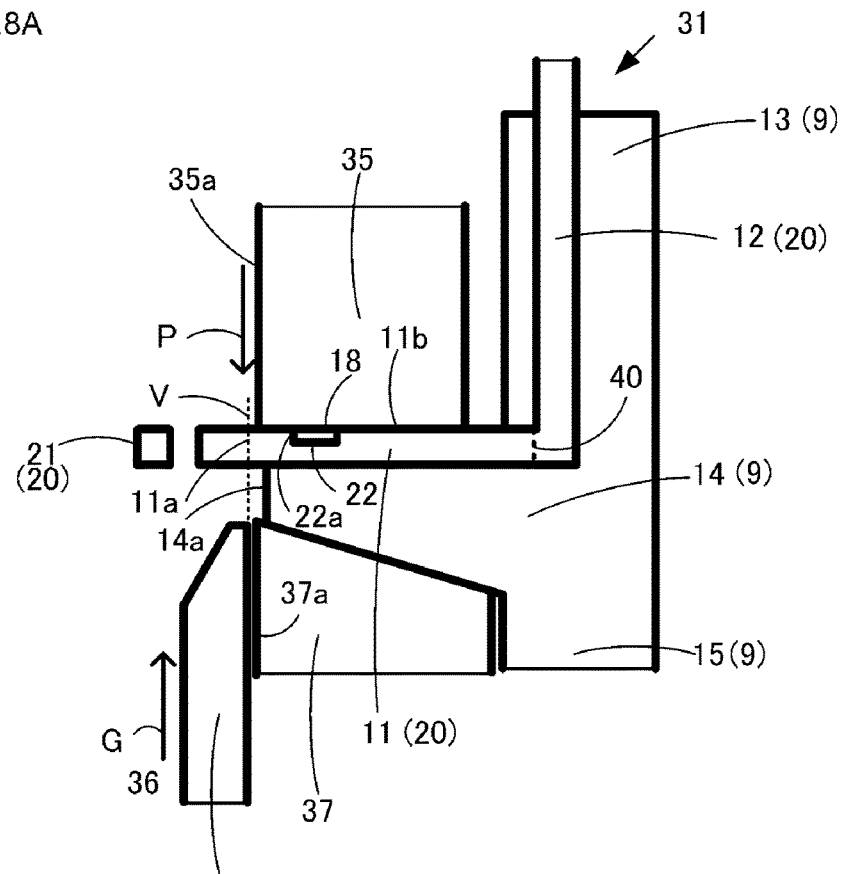
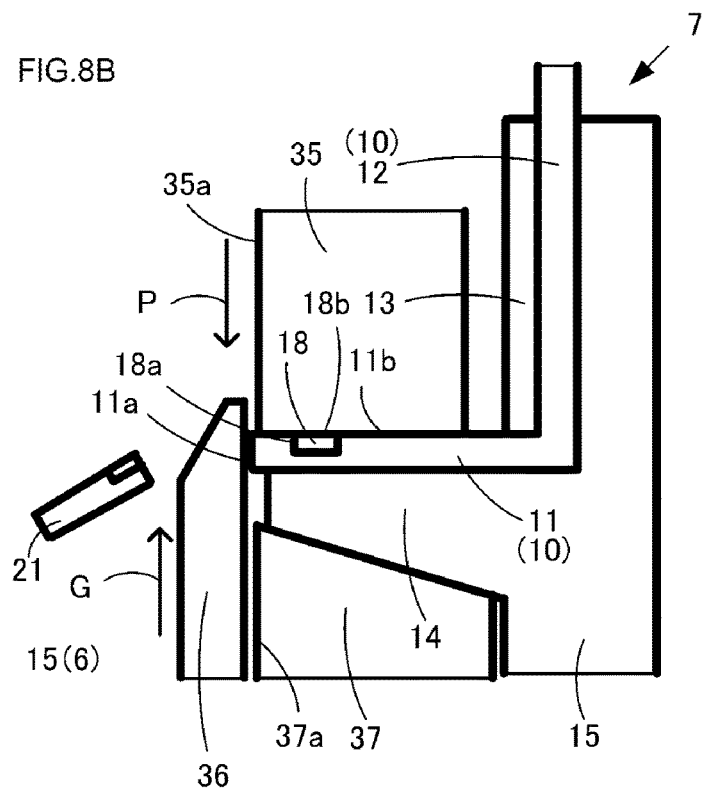

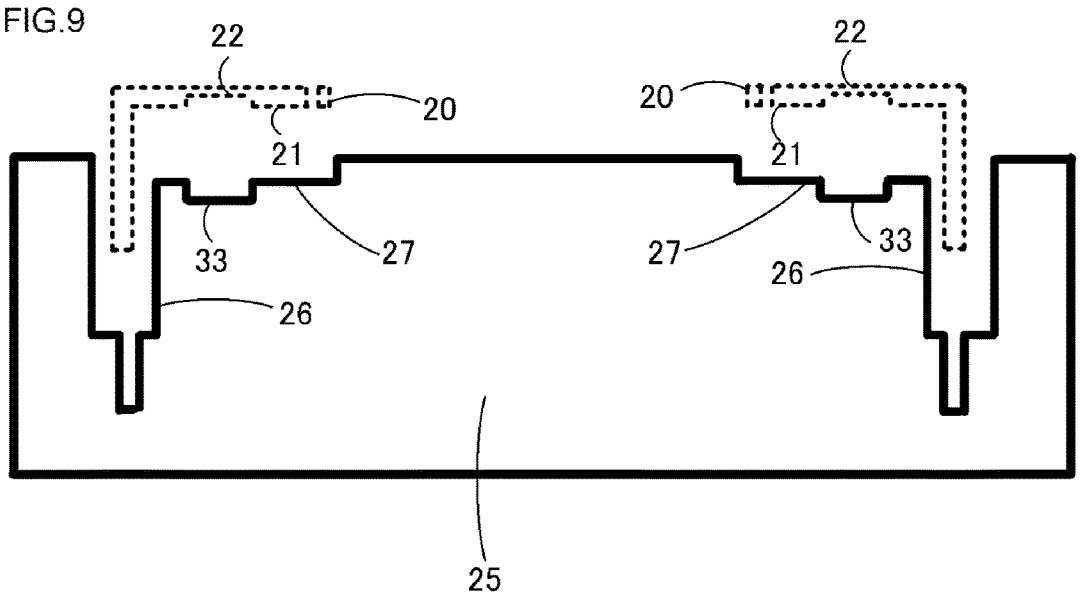

Prior Art

US 9,761,462 B2

RESIN PACKAGE WITH A GROOVE FOR AN EMBEDDED INTERNAL LEAD

CROSS-REFERENCE TO RELATED APPLICATION

The application claims priority of Japanese Patent Application No. 2014-243588 filed on Dec. 2, 2014, the disclosure of which is incorporated herein.

BACKGROUND OF THE INVENTION

1. Field of the Invention

The present invention relates to a semiconductor device, and a method of manufacturing the semiconductor device.

2. Description of the Background Art

FIGS. 20A and 20B are diagrams of an existing IGBT module 900. FIG. 20A is a top view. FIG. 20B is a sectional view cut along a line 20B-20B of FIG. 20A. Herein, an upper cover and gel filling the interior are not shown in the drawings.

The IGBT module 900 includes a heat release plate 51, an insulating substrate 53 fixed with solder 52 on the heat release plate 51, and a semiconductor element 55 fixed with solder 54 on the insulating substrate 53. Also, the IGBT module 900 includes an insert terminal case 57 fixed with adhesive 56 on the heat release plate 51, and bonding wire 58 fixed to the insert terminal case 57, semiconductor element 55, and insulating substrate 53. The insert terminal case 57 includes a resin case 59 and an external lead-out terminal 60. The external lead-out terminal 60 includes an internal terminal 61 (inner lead), and an external terminal 62 (outer lead) connected at a right angle to the internal terminal 61. An inner wall 59a of the resin case 59 has an L-form, and the resin case 59 includes an upper side vertical resin portion 63 (hereafter called simply a vertical resin portion), and a horizontal resin portion 64 and lower side vertical resin portion 65 linked to the vertical resin portion 63. The external terminal 62 is inserted with the leading end thereof being exposed into the vertical resin portion 63, and the internal terminal 61 is embedded with the surface thereof being exposed in a groove 66 formed in the horizontal resin portion 64. Although it is desirable that a leading end 61a of the internal terminal 61 and a side wall 64a of the horizontal resin portion 64 are even without a step, there may be a step. The bonding wire 58, which forms wiring, is joined by ultrasonic bonding to a surface 61b of the exposed internal terminal 61. Also, the heat release plate 51 is fixed with the adhesive 56 to the lower side vertical resin portion 65.

The insert terminal case 57 is formed by a lead frame 70 disposed in a die, the lead frame 70 being inserted in the resin case 59 by injection molding, and an unnecessary terminal coupling portion 71 being cut off. The terminal coupling portion 71 is a portion that couples the internal terminals 61.

FIGS. 21A and 21B are illustrations showing a terminal coupling portion 71 cut off from the lead frame 70. FIGS. 21A and 21B are enlarged views of a B portion of FIG. 20B. FIG. 21A is an illustration before cutting. FIG. 21B is an illustration after cutting.

A downward pressurizing force $F_p$ is applied to an upper support body 85, thereby sandwiching the lead frame 70 and horizontal resin portion 64 between the upper support body 85 and a lower support body 87. Next, the terminal coupling portion 71 protruding from the resin case 59 and the horizontal resin portion 64 of the resin case 59 fixed to the lead frame 70 is cut off from the lead frame 70 by a cutting blade 86 moved upward in a G direction. As positioning of the cutting blade 86 is carried out via the lower support body 87 with the side wall 64a of the horizontal resin portion 64 as a reference, a distance J1 between the leading end 61a (cutting place V) of the internal terminal 61 and the side wall 64a of the horizontal resin portion 64 can be shortened further when a cutting blade 86 of tie bar cutting is moved upward from below in the G direction than when the cutting blade 86 is moved downward from above. Furthermore, a movement in the G direction is preferable as the surface 61b of the flat internal terminal 61 can be suppressed by the upper support body 85. Cutting of the terminal coupling portion is called tie bar cutting.

Also, Patent Document 1 discloses such that when a bonding wire is joined by ultrasound to an internal terminal forming an insert terminal case, the internal terminal is prevented from being pulled by the bonding wire and moving when a bonder is moved, and the internal terminal is prevented from lifting up from the resin case and causing defective ultrasonic bonding.

Patent Document 1: JP-A-2000-332179.

FIG. 22 is an illustration when tie bar cutting is carried out in a state wherein the pressurizing force $F_p$ from the upper support body 85 is insufficient. A state where the pressurizing force $F_p$ is insufficient refers to a case wherein, although the upper support body 85 contacts the internal terminal 61, the pressurizing force $F_p$ is small. When the pressurizing force $F_p$ from the upper support body 85 is insufficient, the upper support body 85 is lifted upward in an E direction by the upward lifting force of the cutting blade 86, and becomes deformed. Further, it may happen that the vicinity of the leading end 61a of the internal terminal 61 separates from the horizontal resin portion 64, and a gap T of 10 μm is formed under the internal terminal 61 at the ultrasonic bonding place.

FIG. 23 is an illustration when a wire bonding onto the internal terminal is carried out in a state shown in FIG. 22.

When the gap T exists under the internal terminal, a wire load F (the force by which the wire 58 is pushed down on the internal terminal 61 via a head 90) when ultrasonic bonding is carried out is not sufficiently applied to the internal terminal 61, and ultrasonic vibration is not transmitted to the internal terminal 61 to thereby decrease the wire joining ability. As a decrease in wire joining ability decreases the product lifespan, it is necessary to ensure that no gap T is formed under the internal terminal 61.

Also, the measure for preventing movement of the internal terminal when bonding is described in JP-A-2000-332179, wherein the leading end of the internal terminal is covered with resin, and is fixed to the resin case so that the internal terminal does not move. This is a case wherein the internal terminal is fixed to the resin case after the boundary portion between the internal terminal and terminal coupling portion is cut. Therefore, there is no problem of a gap under the internal terminal formed in a step of cutting the terminal coupling portion off from the internal terminal after the internal terminal is fixed to the resin case.

An object of the invention is to provide a semiconductor device, and a method of manufacturing the semiconductor device, such that the generation of a gap under the internal terminal when cutting the terminal coupling portion from the internal terminal is restricted, thus resolving the heretofore described problem.

SUMMARY OF THE INVENTION

In order to achieve the heretofore described object, an aspect of the invention is a semiconductor device having a terminal case, the semiconductor device including an external lead-out terminal formed of an external terminal and an internal terminal connected to a connecting portion of the external terminal, an upper side vertical resin portion to which the external terminal is fixed, a horizontal resin portion connected to the upper side vertical resin portion, wherein the internal terminal is embedded in a groove, and a lower side vertical resin portion connected to the horizontal resin portion, and having a configuration wherein one portion of the upper surface of the internal terminal is covered by a resin fixed portion connected to the horizontal resin portion, and a leading end surface in the longitudinal direction of the internal terminal on the side opposite to that of the connecting portion is an exposed cutting plane.

Also, it is preferable that an L-form stepped portion is disposed from the leading end surface of the internal terminal toward the connecting portion side, the resin fixed portion is disposed in the L-form stepped portion, and the exposed upper surface of the internal terminal and the upper surface of the resin fixed portion are connected evenly.

Also, it is preferable that an L-form stepped portion is disposed from the leading end surface of the internal terminal toward the external terminal, the resin fixed portion is disposed in the L-form stepped portion, and the upper surface of the resin fixed portion protrudes from the exposed upper surface of the internal terminal.

Also, it is preferable that a depressed portion is disposed in the lateral direction of the internal terminal, the resin fixed portion is disposed in the depressed portion, and the exposed upper surface of the internal terminal and the upper surface of the resin fixed portion are connected evenly.

Also, it is preferable that a depressed portion is disposed in the internal terminal, the resin fixed portion is disposed in the depressed portion, and the upper surface of the resin fixed portion protrudes from the exposed upper surface of the internal terminal.

Also, it is preferable that the exposed upper surface of the internal terminal is even, and the resin fixed portion is disposed on the internal terminal upper surface.

Also, in a method of manufacturing the semiconductor device, the manufacturing method includes a step of disposing a lead frame having a terminal coupling portion connected to the internal terminal of the external lead-out terminal in a die, a step of injecting a liquid resin into the die and hardening the liquid resin, thereby forming a lead frame structural body having a resin fixed portion, a step of removing the lead frame structural body from the die, and a step of cutting the terminal coupling portion, thereby forming a terminal case.

Also, in the manufacturing method, one depressed portion continuous with the internal terminal and a terminal coupling portion is formed, the depressed portion is filled with a resin that becomes the resin fixed portion, and the resin filling the depressed portion and the lead frame under the depressed portion are cut simultaneously.

Also, in the manufacturing method, a depressed portion is formed in the lateral direction of the internal terminal, the depressed portion is filled with a resin that becomes the resin fixed portion, and the lead frame on the terminal coupling portion side, in which the depressed portion is not formed, is cut.

Also, in the manufacturing method, a resin that becomes the resin fixed portion is formed on the upper surface of a flat place continuous with the internal terminal and terminal coupling portion, and the resin and the lead frame under the resin are cut simultaneously.

Also, in the manufacturing method, the resin that becomes the resin fixed portion is formed in a lateral direction on the flat upper surface of the internal terminal, and the lead frame on the terminal coupling portion side, on which the resin is not formed, is cut.

According to the invention, the generation of a gap under the internal terminal when cutting the terminal coupling portion off from the internal terminal can be restricted.

BRIEF DESCRIPTION OF THE DRAWINGS

FIG. 3 is a manufacturing step diagram following FIG. 2;

FIG. 4 is a manufacturing step diagram following FIG. 3;

FIGS. 6A to 6C are manufacturing step diagrams following FIGS. 5A and 5B;

FIGS. 8A and 8B are manufacturing step diagrams of a semiconductor device of a second embodiment according to the invention;

FIG. 9 is a manufacturing step diagram of a semiconductor device of a third embodiment according to the invention;

FIGS. 11A and 11B are diagrams of the first semiconductor device according to the invention, wherein FIG. 11A is a top view, and FIG. 11B is a sectional view cut along a line 11B-11B of 11A;

FIGS. 12A to 12C are diagrams of the first semiconductor device according to the invention, wherein FIG. 12A is an enlarged plan view of an A portion of FIG. 11A, FIG. 12B is an enlarged sectional view of an A portion of FIG. 11B, and FIG. 12C is an enlarged perspective view of FIG. 12B seen from an arrow B;

FIGS. 13A and 13B are diagrams of a second semiconductor device according to the invention, wherein FIG. 13A is a top view, and FIG. 13B is a sectional view cut along a line 13B-13B of 13A;

FIGS. 14A and 14B are diagrams of a third semiconductor device according to the invention, wherein FIG. 14A is a top view, and FIG. 14B is a sectional view cut along a line 14B-14B of 14A;

FIGS. 16A and 16B are diagrams of a fourth semiconductor device according to the invention, wherein FIG. 16A is a top view, and FIG. 16B is a sectional view cut along a line 16B-16B of FIG. 16A;

FIGS. 17A and 17B are diagrams of a fifth semiconductor device according to the invention, wherein FIG. 17A is a top view, and FIG. 17B is a sectional view cut along a line 17B-17B of FIG. 17A;

FIGS. 18A and 18B are diagrams of a sixth semiconductor device according to the invention, wherein FIG. 18A is a top view, and FIG. 18B is a sectional view cut along a line 18B-18B of FIG. 18A;

FIGS. 19A and 19B are diagrams of a seventh semiconductor device according to the invention, wherein FIG. 19A is a top view, and FIG. 19B is a sectional view cut along a line 19B-19B of FIG. 19A;

DETAILED DESCRIPTION OF THE INVENTION

Embodiments

FIGS. 1A to 6B are manufacturing step diagrams showing a method of manufacturing a semiconductor device 100 of a first embodiment according to the invention, and are shown in the order of steps. Herein, a method of forming an insert terminal case 7 is shown. Numbers in parentheses indicate a step order.

Figure 1A:
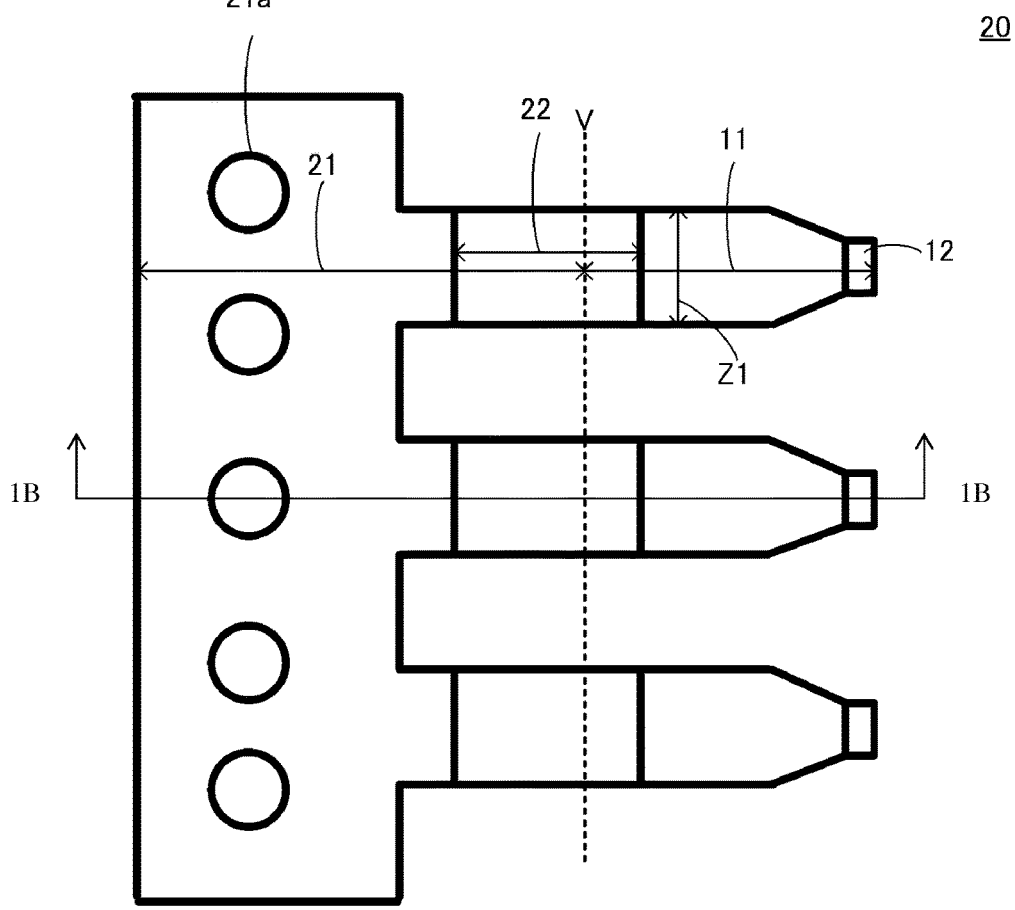
FIGS. 1A and 1B are manufacturing step diagrams of a semiconductor device of a first embodiment according to the invention.
Figure 1B:
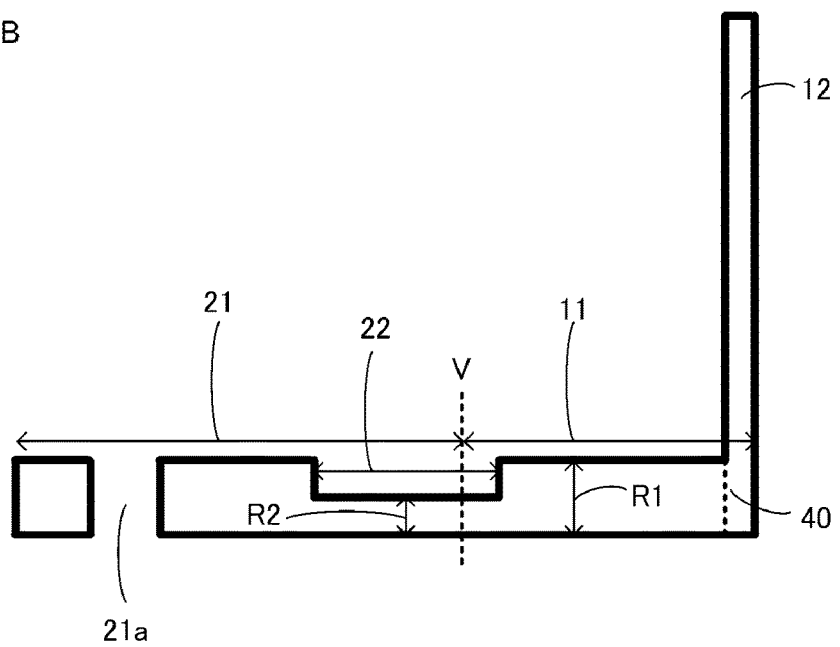
Figure 12A:
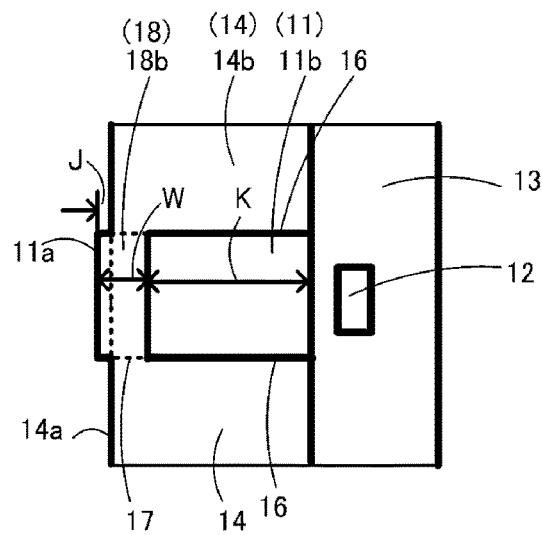
Figure 12B:
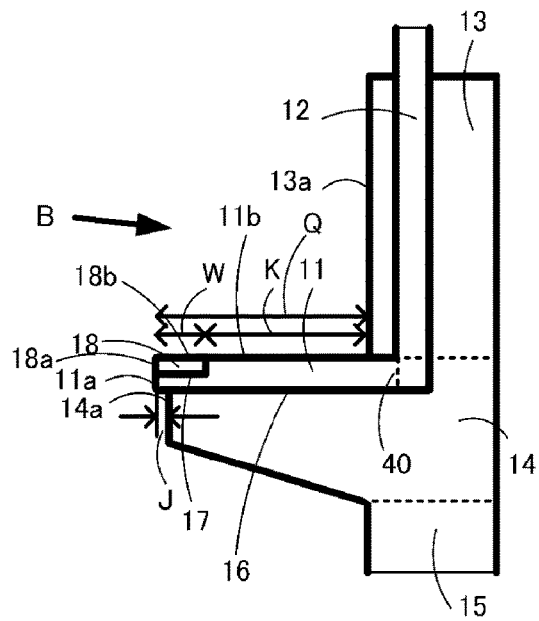

(1) A lead frame 20 shown in FIGS. 1A and 1B is prepared. FIGS. 1A and 1B are diagrams of the lead frame 20. FIG. 1A is a plan view. FIG. 1B is a sectional view cut along a line 1B-1B of FIG. 1A. The lead frame 20 includes an external terminal 12, an internal terminal 11, and a terminal coupling portion 21 connecting internal terminals 11. The external terminal 12 and internal terminal 11 are linked by a connecting portion 40. A depressed portion 22 is formed from the internal terminal 11 toward the terminal coupling portion 21 sandwiching a cutting place V cut by a tie bar cutting. As shown in FIG. 12B, the depressed portion 22 becomes an L-form stepped portion 17, and the cutting place V becomes a leading end 11a of the internal terminal 11. Also, the depressed portion 22 is formed by a press processing or the like. Of course, a protruding portion may be provided on a roller, and a plate in which a depressed portion is formed by rolling using the roller (a plate normally called deformed material) may be used. The material of the lead frame 20 is, for example, copper, and the surface thereof is coated with, for example, nickel plating. This is not limiting, however, provided that the materials are generally used materials. Also, a width Z1 of the internal terminal 11 is about 3 mm and a thickness R1 is about 1 mm, while a thickness R2 of the depressed portion 22 is from 0.1 to 0.7 mm, and preferably from 0.4 to 0.6 mm. The ratio of R2 to R1 (R2/R1) is from 0.1 to 0.7, preferably from 0.4 to 0.6. In this range, deformation of the internal terminal when tie bar cutting is carried out can be more effectively suppressed. Also, the terminal coupling portion 21 forming the lead frame 20 is an unnecessary portion cut off by the tie bar cutting. A large number of through holes 21a may be formed in the terminal coupling portion 21. The through holes 21a are formed when the lead frame 20 is formed from a flat plate. The through holes 21a are used in conveying and positioning of the lead frame.

Figure 2:
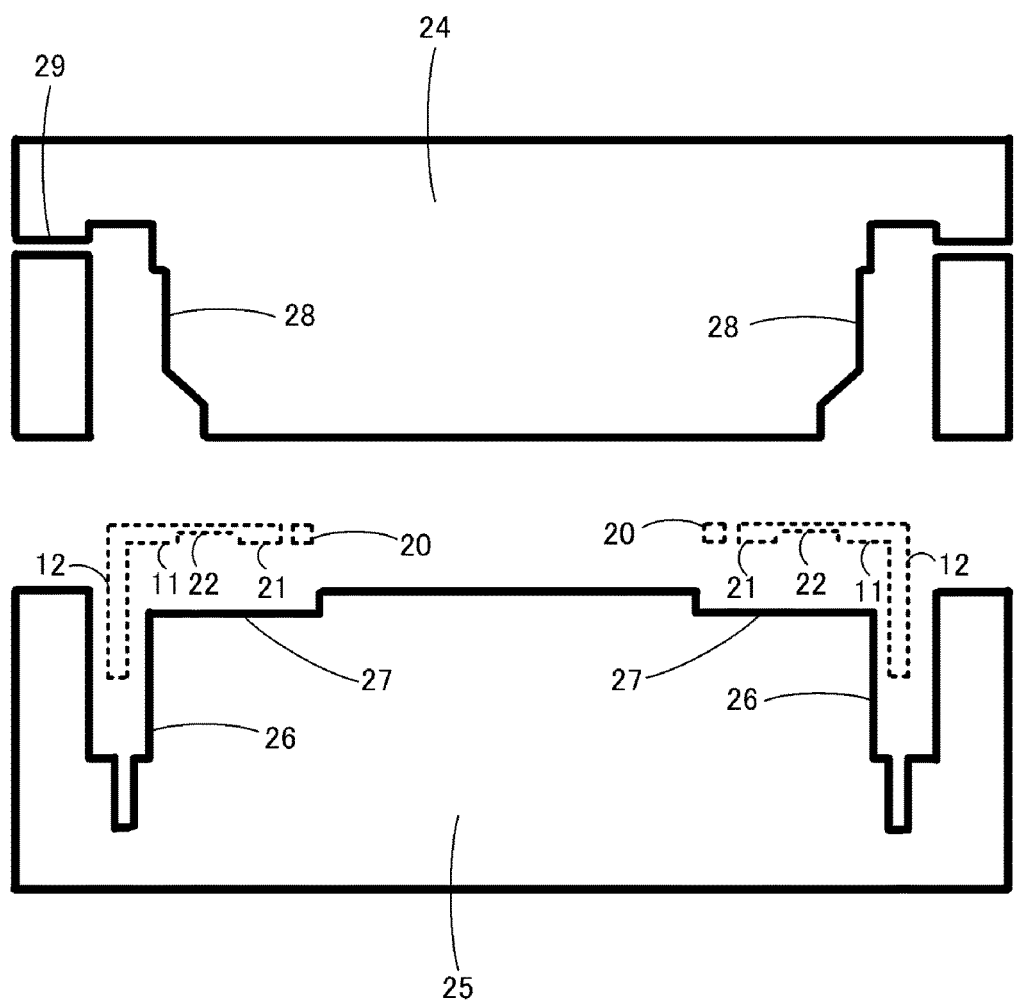
FIG. 2 is a manufacturing step diagram following FIGS. 1A and 1B.

Next, a resin molding die 23 shown in FIG. 2 is prepared. FIG. 2 is a sectional view. The die 23 is formed of an upper die 24 and a lower die 25. A depressed portion 26 in which the external terminal 12 is inserted, and furthermore, a depressed portion 27 in which the internal terminal 11, terminal coupling portion 21, and depressed portion 22 are embedded, are formed in the lower die 25. A depressed portion 28 for forming a horizontal resin portion 14 and lower side vertical resin portion 15 are formed in the upper die 24. The horizontal resin portion 14 and lower side vertical resin portion 15 are shown in FIGS. 6A to 6C. An injection port 29 of the upper die 24 is used for injecting a resin solution 30.

(2) In FIG. 3, the lead frame 20 is placed in the lower die 25, and then, the upper die 24 is placed on the lower die 25. Positioning of the lead frame 20 with respect to the lower die 25 is carried out by fitting the terminal coupling portion 21 of the lead frame 20 in the depressed portion 27 formed in the lower die 25. Also, a leading end 12a of the external terminal 12 is fitted into a leading end 26a of the depressed portion 26 of the lower die 25, and utilized as positioning. FIG. 3 is a diagram when the lead frame 20 is disposed in the die 23.

(3) In FIG. 4, the resin solution 30 is injected into the die from the injection port 29, and the resin solution 30 is hardened at a temperature of about 200° C., thereby forming a resin case 9. FIG. 4 is an illustration when the resin solution 30 is hardened. A PPS (polyphenylene sulfide) resin, or the like, is used as the resin solution 30.

Figure 5A:
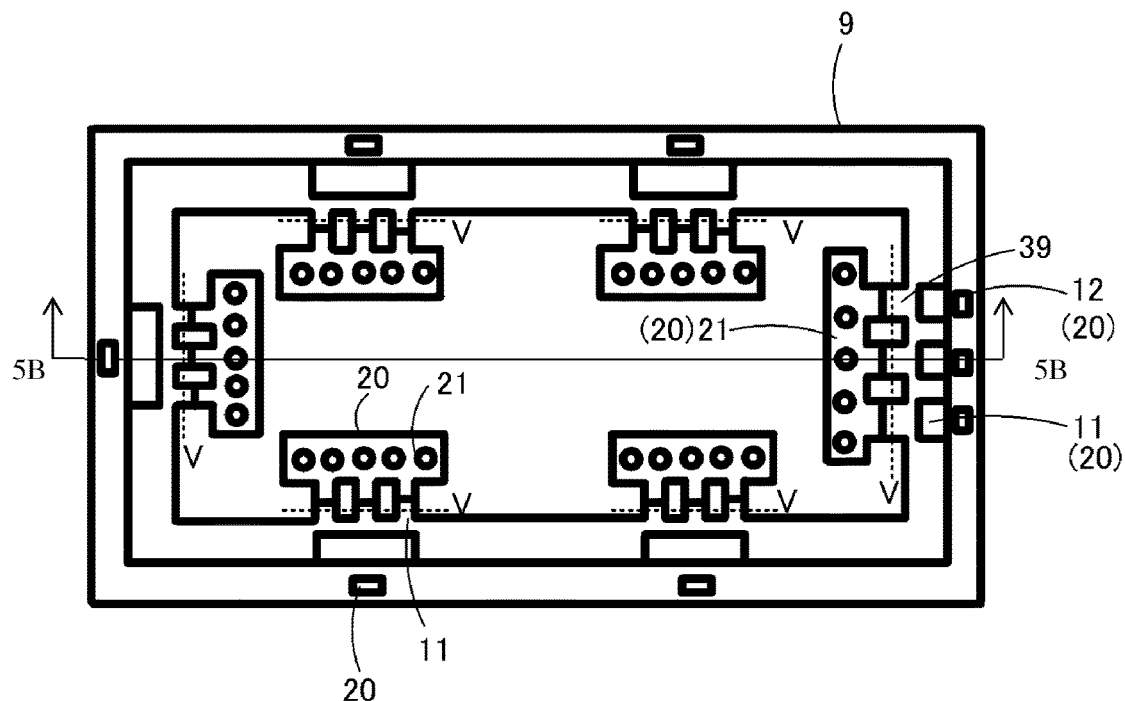
FIGS. 5A and 5B are manufacturing step diagrams following FIG. 4.
Figure 5B:
Figure 12C:
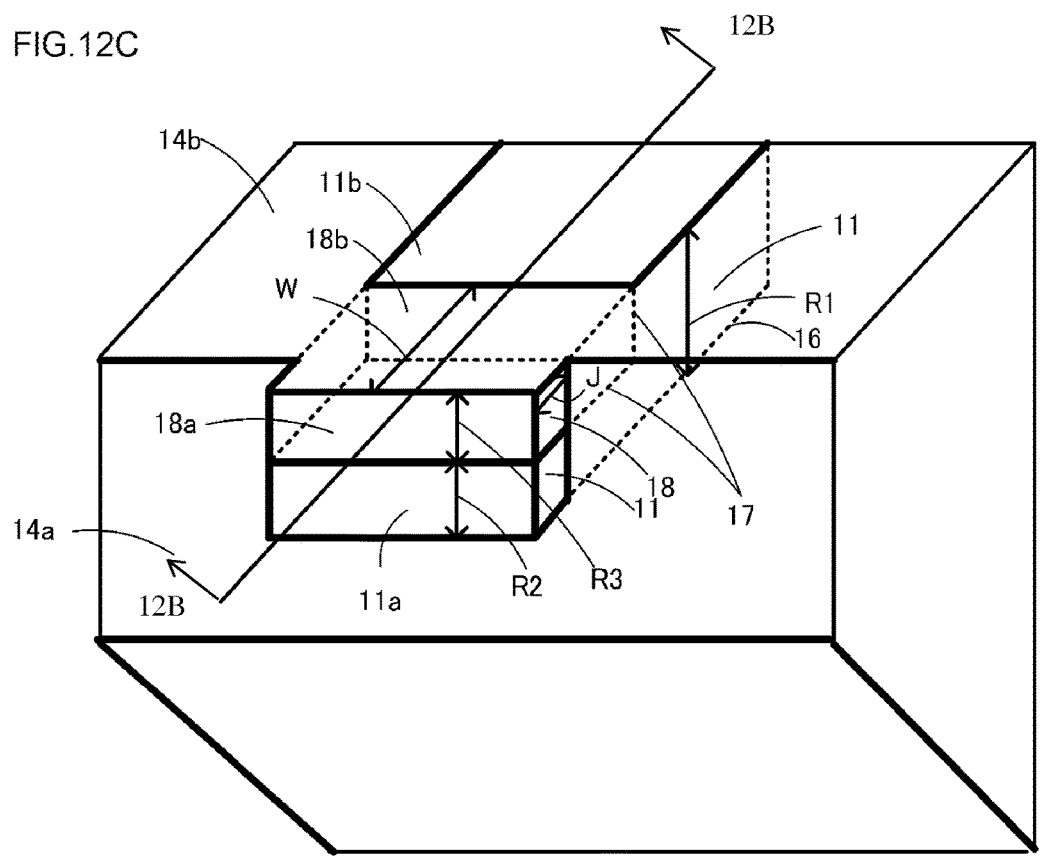

(4) In FIGS. 5A and 5B, the lead frame 20 on which the resin case 9 is formed (hereafter called a lead frame structural body 31) is removed from the die 23. FIGS. 5A and 5B are diagrams when the lead frame structural body 31 is removed from the die 23. FIG. 5A is a plan view. FIG. 5B is a sectional view cut along a line 5B-5B of FIG. 5A. The cutting place V indicated by a dotted line is provided in the depressed portion 22 of the lead frame 20 between the internal terminal 11 and terminal coupling portion 21. Resin 39 that becomes a resin fixed portion 18 is embedded in the depressed portion 22. It is preferable that a surface 11b of the internal terminal 11 and a surface 14b of the horizontal resin portion 14 are of the same height, as shown in FIGS. 12A to 12C and the like. However, the surface 11b of the internal terminal 11 may be higher or lower than the surface 14b of the horizontal resin portion 14.

(5) In FIGS. 6A to 6C, cutting is carried out at the position of the dotted line V that becomes the leading end 11a of the internal terminal 11 connected to the terminal coupling portion 21 exposed from the resin case 9, thereby forming the insert terminal case 7 from the lead frame structural body 31. The cutting is carried out by the tie bar cutting. The tie bar cutting refers to a case wherein the internal terminal 11 and terminal coupling portion 21 (refer to FIGS. 5A and 5B) are linked in a multiple of places, and the multiple of linked places (tie bars) are cut simultaneously.

The internal terminal 11 is held down in a P direction by an upper support body 35. This holding force is taken as $F_p$. As it is preferable that a side surface 35a of the upper support body 35 is disposed above the vicinity of a leading end 14a of the horizontal resin portion 14, the side surface 35a is disposed in proximity to the cutting place V cut by the cutting blade 86 of the tie bar cutting. A cemented carbide such as high-speed steel or tungsten carbide is used for the cutting blade.

Cutting is mainly carried out using the shear stress of the cutting blade 36. However, owing to the existence of the resin fixed portion 18, the vicinity of the cutting place V of the lead frame 20 can be prevented from being lifted by the upward force received from the cutting blade 36. The tie bar cutting is carried out by the cutting blade 36 moved in a G direction along a side wall 37a of a lower support body 37 in a direction from the back surface to the front surface of the horizontal resin portion 14. The position of the lower support body 37 can be changed, and the distance from the side wall 37a of the lower support body 37 to the leading end 14a of the horizontal resin portion can thus be changed. By positioning the cutting blade 36 with the side wall 37a of the lower support body 37 as a reference, a distance J shown in FIG. 12B, to be described hereafter, can be reduced. The distance J is the distance from the cutting place V to the leading end 14a of the horizontal resin portion. Further, by reducing the distance from the side wall 37a of the lower support body 37 to the leading end 14a of the horizontal resin portion, the distance J can be reduced.

Also, FIGS. 6A to 6C are illustrations showing the tie bar cutting. FIG. 6A is a sectional view before the tie bar cutting. FIG. 6B is a sectional view after the tie bar cutting. FIG. 6C is a plan view of the insert terminal case 7 after the tie bar cutting. The lower support body 37 is utilized as a support stand on which the resin case 9 of the lead frame structural body 31 is placed, and for positioning the cutting blade 36. Also, there is a case wherein the whole device is vertically reversed, and cutting is carried out by the cutting blade 36 moved downward from above. In this case, the surface 11b of the internal terminal 11 is placed on the upper holding member 35 positioned on the lower side.

In the previously described step (5), the resin 39 that becomes the resin fixed portion 18 is disposed in a thin place (the depressed portion 22) inwardly from the leading end 11a in the internal terminal 11, whereby the internal terminal 11 is fixed by the resin 39. Therefore, a gap under the internal terminal 11 when carrying out the tie bar cutting is restricted, even when the pressurizing force $F_p$ of the upper holding member 35 is insufficient. As a result, wire joining ability can be increased. This manufacturing method can also be applied when manufacturing a semiconductor device 200 shown in FIGS. 13A and 13B, or the like.

Figure 7:
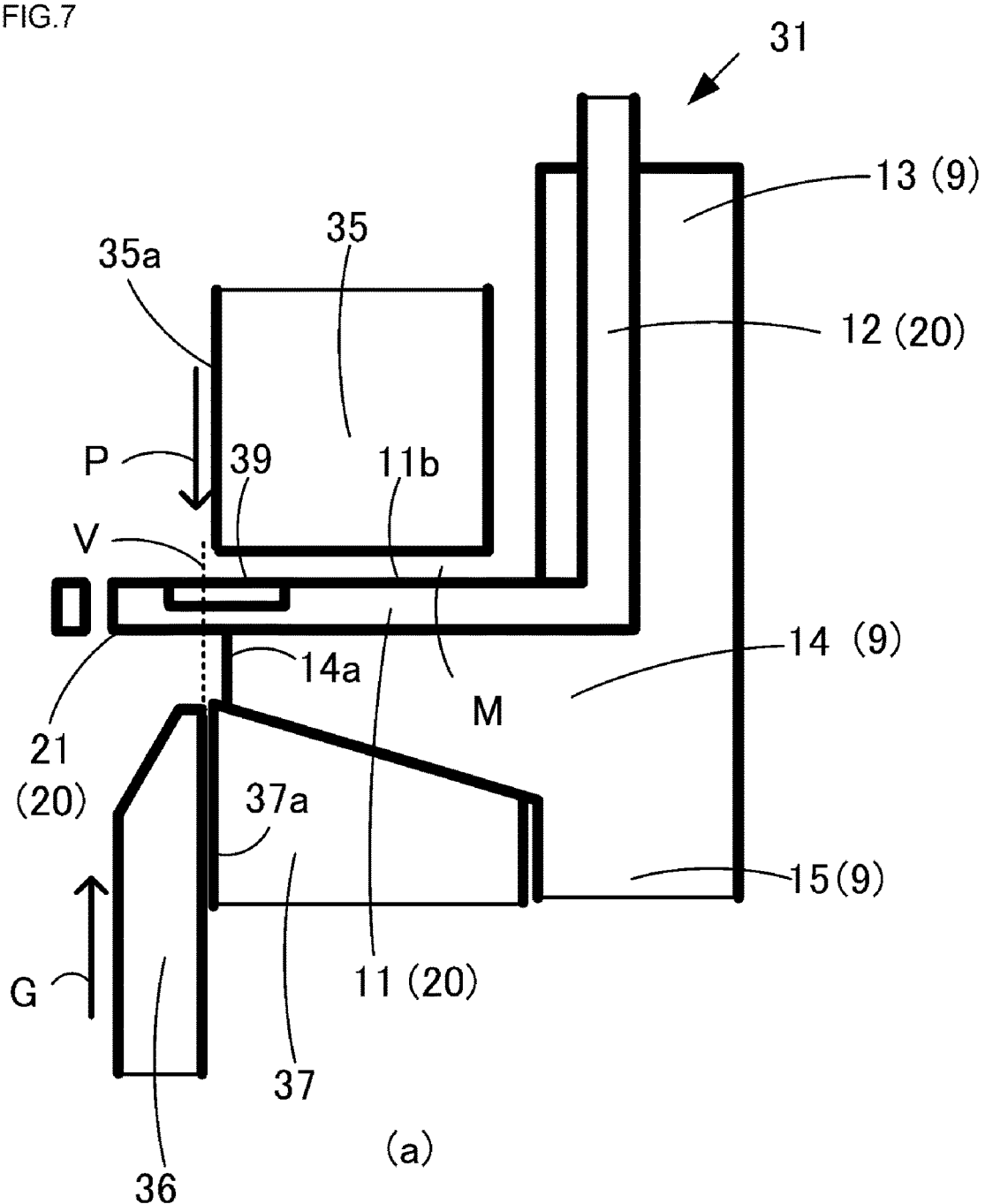
FIG. 7 is an illustration when pressurized by an upper support body is insufficient.

Also, when the tensile strength of the resin fixed portion 18 is sufficient, there is no need for the internal terminal 11 to be held down with sufficient pressurizing force $F_p$ by the upper support body 35, and in an extreme case, there may be a gap M, as shown in FIG. 7. When a large number of places in the lead frame that becomes internal terminals is held down simultaneously by the upper support body 35, variation occurs in the pressurizing force $F_p$, and in an extreme case the gap M may be formed. In this case, the internal terminal 11 is held down by the resin 39, preventing the internal terminal 11 from being lifted by the cutting blade 36. The role of the upper support body 35 in this case is mainly to receive the force when the tie bar cutting for the cutting blade 36 moves in the upward G direction when cutting, thereby preventing the lead frame structural body 31 from lifting from the lower support body 37. Consequently, when there is an action of fixing the lead frame structural body 31 to the lower support body 37, the upper support body 35 is unnecessary.

Figure 14A:
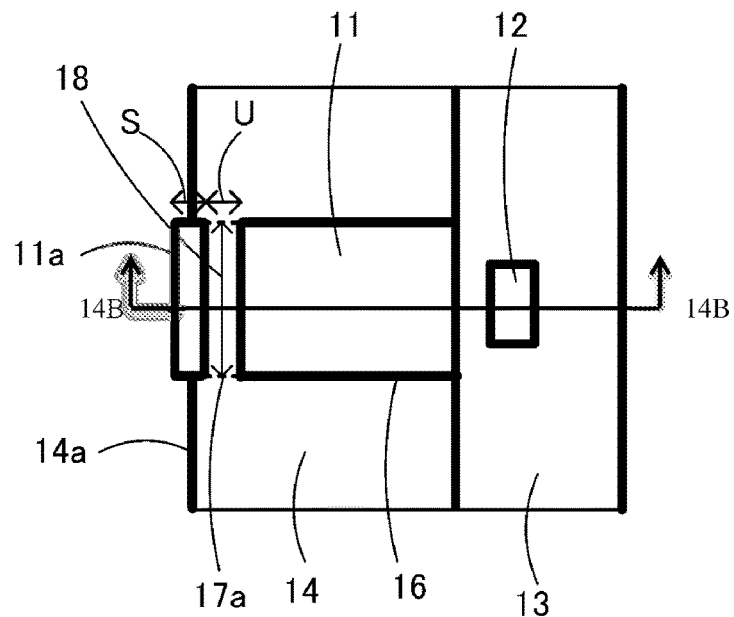
Figure 14B:
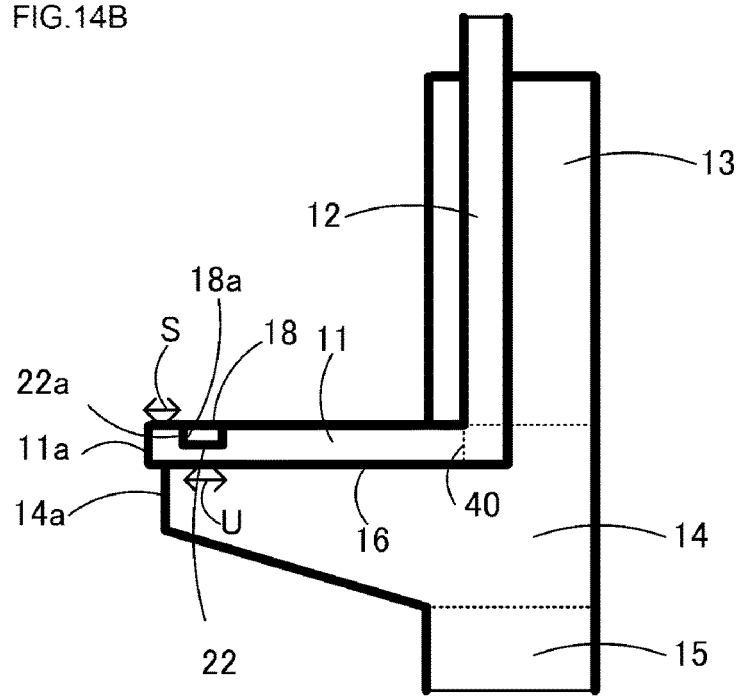

FIGS. 8A and 8B are manufacturing step diagrams of a semiconductor device 300 of a second embodiment according to the invention. FIGS. 8A and 8B are illustrations showing cutting of the internal terminal 11. The semiconductor device 300 is shown in FIGS. 14A and 14B.

A difference from the first embodiment is that the depressed portion 22 is provided in a place in the internal terminal 11 on the connecting portion 40 side of the leading end 11a in step (1). In step (5) shown in FIGS. 8A and 8B, cutting is carried out in a place that is the leading end 11a of the internal terminal 11, in which the depressed portion 22 is not formed and where there is no resin fixed portion 18. An end portion of the depressed portion 22 on the leading end 11a side of the internal terminal 11 is taken to be 22a.

In order to prevent the lead frame structural body 31 from being lifted up from the lower support body 37 against the shearing force, the distance from the leading end 11a to 22a of the depressed portion 22 is preferably 0.1 mm to 3 mm, and more preferably 0.1 mm to 1 mm. This is because when the distance from the leading end 11a to 22a of the depressed portion 22 is short, the bending moment of the cutting force can be reduced. As the resin fixed portion 18 is provided, the generation of a gap is considerably restricted in comparison with an existing semiconductor device. Also, as only the lead frame 20 is cut, there is an advantage in that cutting is easy.

Figure 16A:
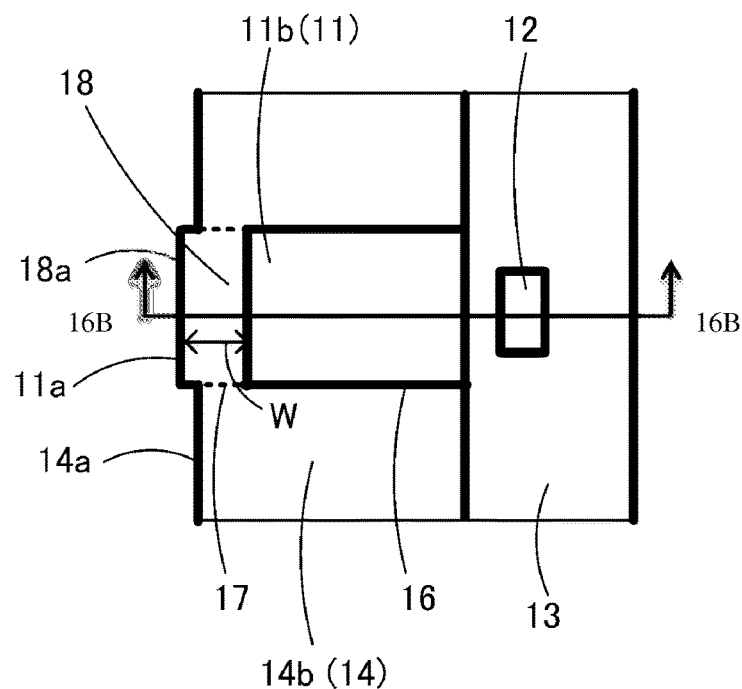
Figure 16B:
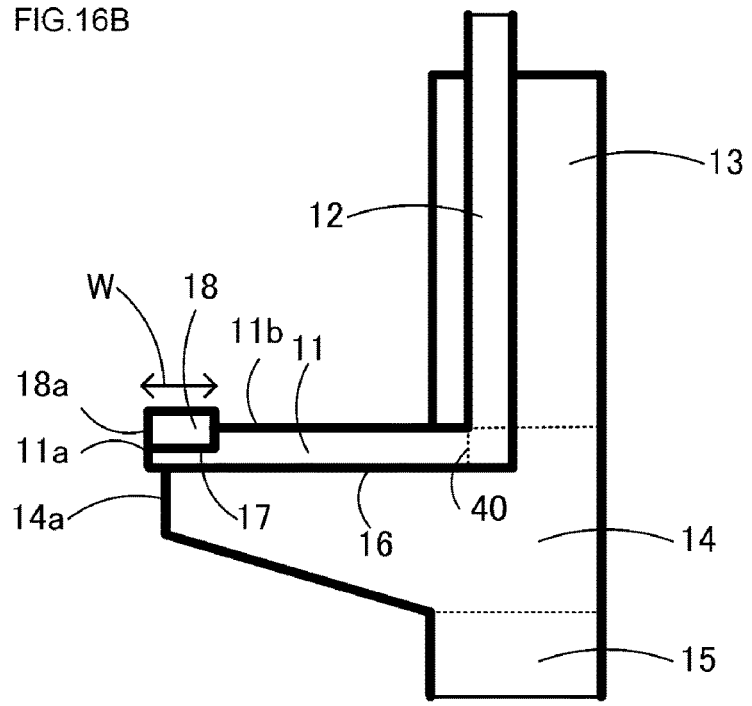

FIG. 9 is a manufacturing step diagram of a semiconductor device 400 of a third embodiment according to the invention. The semiconductor device 400 is shown in FIGS. 16A and 16B. FIG. 9 is a plan view of the lower die 25.

A difference from the first embodiment is that a depressed portion 33 to be filled with resin that becomes the resin fixed portion 18 is provided from the vicinity of the leading end 11a of the internal terminal 11 to the terminal coupling portion 21 in the lower die 25 in step (1). The depressed portion 33 is formed so as to correspond to the depressed portion 22. In this case, the resin that forms the resin fixed portion 18 protrudes from the surface 11b of the internal terminal 11. The greater the height of the protrusion from the surface 11b of the internal terminal 11, the more the cutting force is resisted. However, when the height is too great, there are also problems such as becoming an impediment to the bonding wire, or being difficult to hold down the internal terminal with the upper support body, so that a height of 0.1 mm to 5 mm is preferable, and a height of 1 mm to 2 mm is more preferable still.

The cutting plane is a plane in which a side surface of each of the resin fixed portion 18, horizontal resin portion 14, and internal terminal 11 is exposed and visible. The finished item is the semiconductor device 400 shown in FIGS. 16A and 16B. This example can also be applied when manufacturing a semiconductor device 500 of FIGS. 17A and 17B, or the like. Also, when manufacturing semiconductor devices 600 and 700, an example wherein no L-form stepped portion 17 is formed in the lead frame 20 is used.

Figure 10:
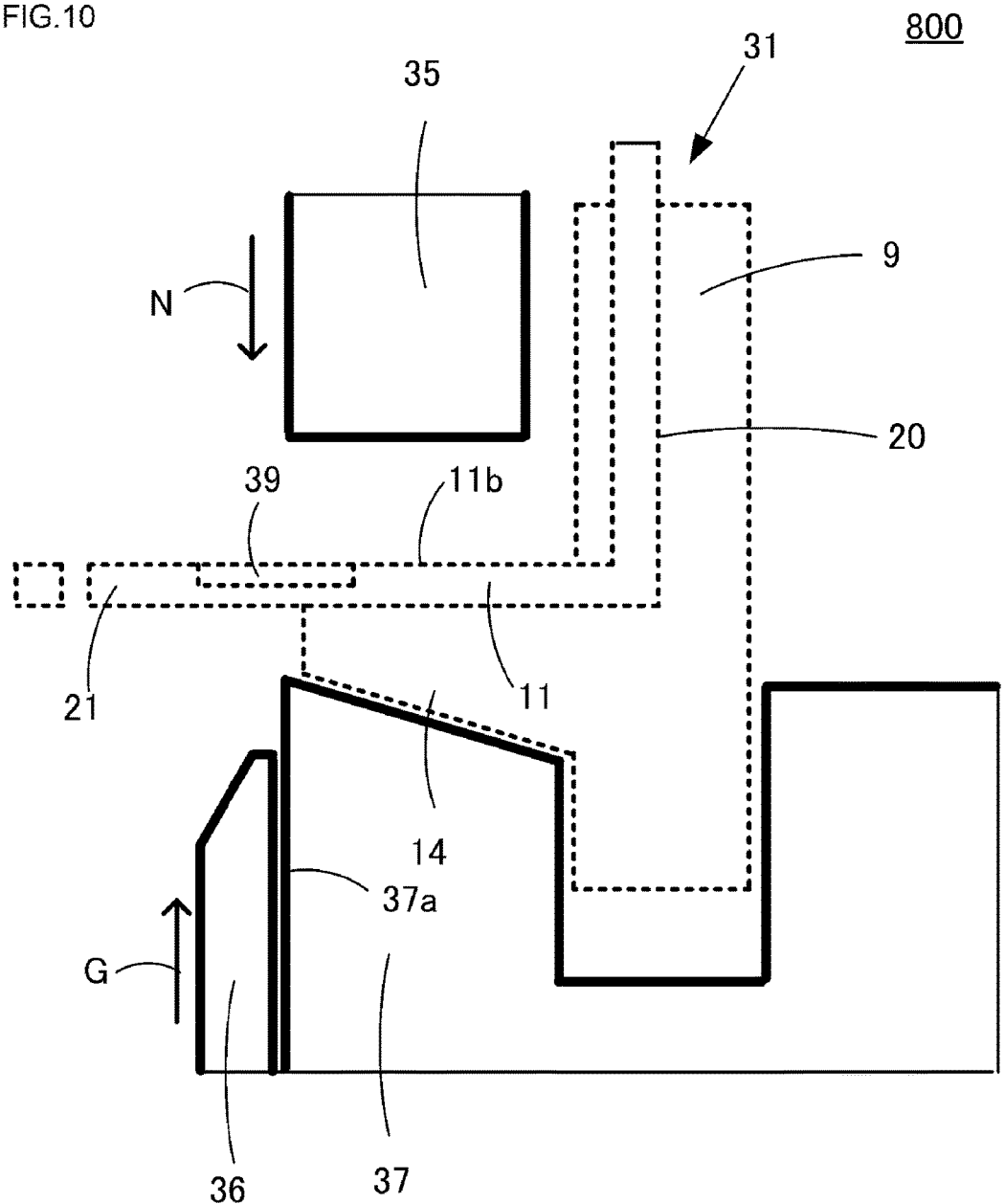
FIG. 10 is a diagram of a tie bar cutting device.

Hereafter, a description will be made to a tie bar cutting device 800, which is a device for manufacturing the semiconductor devices 100 to 700. FIG. 10 is a diagram of the tie bar cutting device 800. The tie bar cutting device 800 includes the lower support body 37, which holds a lower portion of the horizontal resin portion 14 shown by a dotted line, the upper support body 35, which holds down the front side of the horizontal resin portion 14, and the tie bar cutting blade 36, which moves along the side wall 37a of the lower support body 37. Although not shown in the drawing, the tie bar cutting device 800 includes a positioning mechanism that positions each of the members 35, 37, and the cutting blade 36, and a movement mechanism that causes each member to move.

A description will be made to a procedure for the tie bar cutting using the manufacturing device 800. The lower surface of the horizontal resin portion 14 forming the resin case 9 of the lead frame structural body 31 is placed on the lower support body 37. Next, the upper support body 35 is moved in a downward N direction, and placed on the surface 11b of the internal terminal 11 and surface 14b of the horizontal resin portion 14, which are of the same height. The surface 11b of the internal terminal 11 and surface 14b of the horizontal resin portion 14 do not need to be the same height. When the surface 11b of the internal terminal 11 is higher, the upper support body 35 is placed on the surface 11*b* of the internal terminal 11. Next, the horizontal resin portion 14 and internal terminal 11 forming the lead frame structural body 31 are sandwiched by the upper support body 35 and lower support body 37, to pressurize the internal terminal 11 of the lead frame structural body 31 with the upper support body 35. Next, the cutting blade 36 is moved in the G direction along the side wall 37*a* of the lower support body 37, to cut the lead frame. Then, the terminal coupling portion 21 is cut off from the internal terminal 11, to form the insert terminal case 7.

A description will be made to the semiconductor devices manufactured using the manufacturing methods described in the embodiments.

Figure 11A:
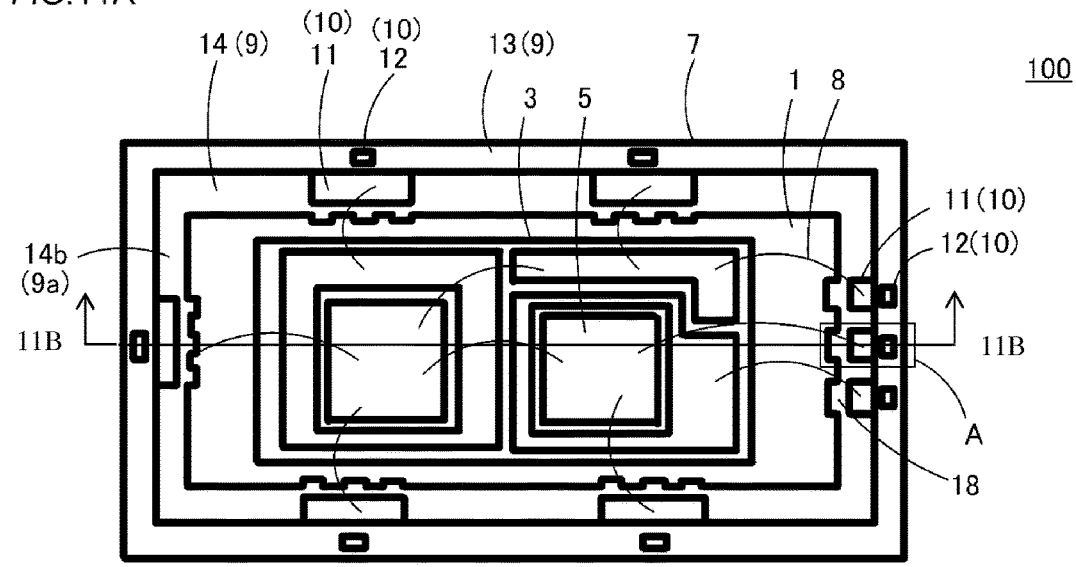
Figure 11B:
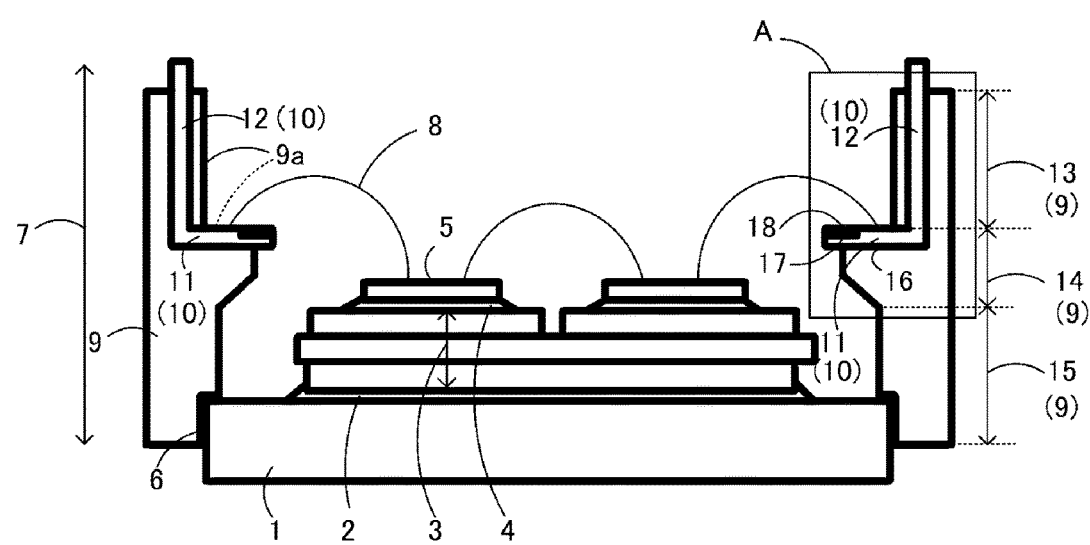

FIGS. 11A and 11B, and 12A to 12C, are diagrams of the first semiconductor device 100 according to the invention. FIG. 11A is a top view. FIG. 11B is a sectional view cut along a line 11B-11B of FIG. 11A. FIGS. 12A to 12C are enlarged views of an A portion of FIGS. 11A and 11B. FIG. 12A is an enlarged plan view of the A portion of FIG. 11A. FIG. 12B is an enlarged sectional view of the A portion of FIG. 11B. FIG. 12C is an enlarged perspective view of FIG. 12B seen from an arrow B. FIG. 12B is a sectional view cut along a line 12B-12B of FIG. 12C. Herein, an upper cover and gel filling the interior are not shown in FIGS. 11A and 11B.

The semiconductor device 100 includes a heat release plate 1, an insulating substrate 3 fixed with solder 2 on the heat release plate 1, and a semiconductor element 5 fixed with solder 4 on the insulating substrate 3. The semiconductor device 100 includes the insert terminal case 7 fixed with adhesive 6 on the heat release plate 1, and bonding wire 8 fixed to the insert terminal case 7, semiconductor element 5, insulating substrate 3, and the like. The insulating substrate 3 is formed of an insulating plate, a conductive layer on the back surface of the insulating plate, and a circuit wiring layer on the front surface of the insulating plate. Also, the insert terminal case 7 is formed of the resin case 9 and an external lead-out terminal 10. The external lead-out terminal 10 includes the internal terminal 11, and the external terminal 12 connected at a right angle to the internal terminal 11. An inner wall 9*a* of the resin case 9 is of an L-form, and the resin case 9 includes an upper side vertical resin portion 13 (hereafter called simply a vertical resin portion), and the horizontal resin portion 14 and lower side vertical resin portion 15 linked to the vertical resin portion 13.

As shown in FIG. 12B, a length Q of the surface 14*b* of the horizontal resin portion 14 is about, for example, 3 mm. The external terminal 12 is inserted into the vertical resin portion 13, a groove 16 is formed in the horizontal resin portion 14, and the internal terminal 11 is embedded in the groove 16 with the surface 11*b* exposed. It is preferable that the surface 11*b* of the internal terminal 11 and the surface 14*b* of the horizontal resin portion 14 are flat. However, the surface 11*b* of the internal terminal 11 may be higher or lower than the surface 14*b* of the horizontal resin portion 14. The heat release plate 1 is fixed with the adhesive 6 to the lower side vertical resin portion 15. Also, the distance J from the leading end 14*a* of the horizontal resin portion 14 to the leading end 11*a* of the internal terminal 11 is preferably 0.1 mm to 2 mm, and more preferably 0.1 mm to 0.5 mm. The distance J depends on the positioning accuracy of the cutting blade 36 (refer to FIGS. 6A to 6C), with the leading end 14*a* of the horizontal resin portion 14 as a reference, and can be reduced as the positioning accuracy increases. Ideally, it is good when the distance J is zero.

A chair-form step is formed from the leading end 11*a* toward the connecting portion 40 in an upper portion of the internal terminal 11 in the vicinity of the leading end 11*a*. The step is the L-form stepped portion 17 formed in the internal terminal 11, and the L-form stepped portion 17 is filled with resin. The resin filling the L-form stepped portion 17 is connected to the horizontal resin portion 14 forming the resin case 9 on either side, to become the resin fixed portion 18. The resin fixed portion 18 is molded integrally with the horizontal resin portion 14, firmly fixing the internal terminal 11. An upper surface 18*b* of the resin fixed portion 18 and the upper surface 11*b* of the internal terminal 11 are connected evenly. Also, the sectional form of the resin fixed portion 18 here is quadrilateral. Herein, the resin fixed portion 18 refers to resin that covers the internal terminal 11 in the width direction.

Also, the leading end 11*a* of the internal terminal 11 is a cutting plane, and this cutting plane is a cutting plane that also becomes a side surface 18*a* of the resin fixed portion 18. Therefore, the leading end 11*a* of the internal terminal 11 and the side wall 18*a* of the resin fixed portion 18 coincide. Also, as the L-form stepped portion 17 is formed, the thickness R2 of the internal terminal 11 at the cutting plane is less than the thickness R1 of the internal terminal 11 on the inner side.

Also, as it comes to a state such that the internal terminal 11 upper surface is held down by the lower die 25 (refer to FIG. 2) and the L-form stepped portion 17 is covered by the lower die 25, the surface 11*b* of the internal terminal 11 and the upper surface 18*b* of the resin fixed portion 18 filling the L-form stepped portion 17 can be even, as previously described.

Also, by forming the resin fixed portion 18 in the leading end of the internal terminal 11, the internal terminal 11 is fixed by the resin fixed portion 18. Therefore, the generation of a gap under the internal terminal 11 is restricted. As a result, wire joining ability increases.

A thickness R3 of the resin fixed portion 18 can be a thickness that withstands a combination of a lifting force of the cutting blade 36 applied to the internal terminal 11 at the tie bar cutting and the pressurizing force $F_p$ of the upper support body 35 (refer to FIGS. 6A to 6C). It is preferable that the thickness R2 of the internal terminal 11 at the cutting place V and the thickness R3 of the resin fixed portion 18 (the height of the step of the L-form stepped portion 17) are the same. It is possible to resist the cutting force when R3 is bigger, but the strength as the internal terminal 11 decreases when R2 is too small. Also, electrical resistance increases. Therefore, the thickness R2 of the internal terminal 11 is preferably 0.1 to 0.7 mm, and more preferably 0.4 to 0.6 mm. Also, the ratio of R2 to R1 (R2/R1) is 0.1 to 0.7, and preferably 0.4 to 0.6. In this range, deformation of the internal terminal when the tie bar cutting is carried out can be suppressed. Although the length Q of the internal terminal 11 is preferably 2 mm to 50 mm, this is not limited.

Figure 22:
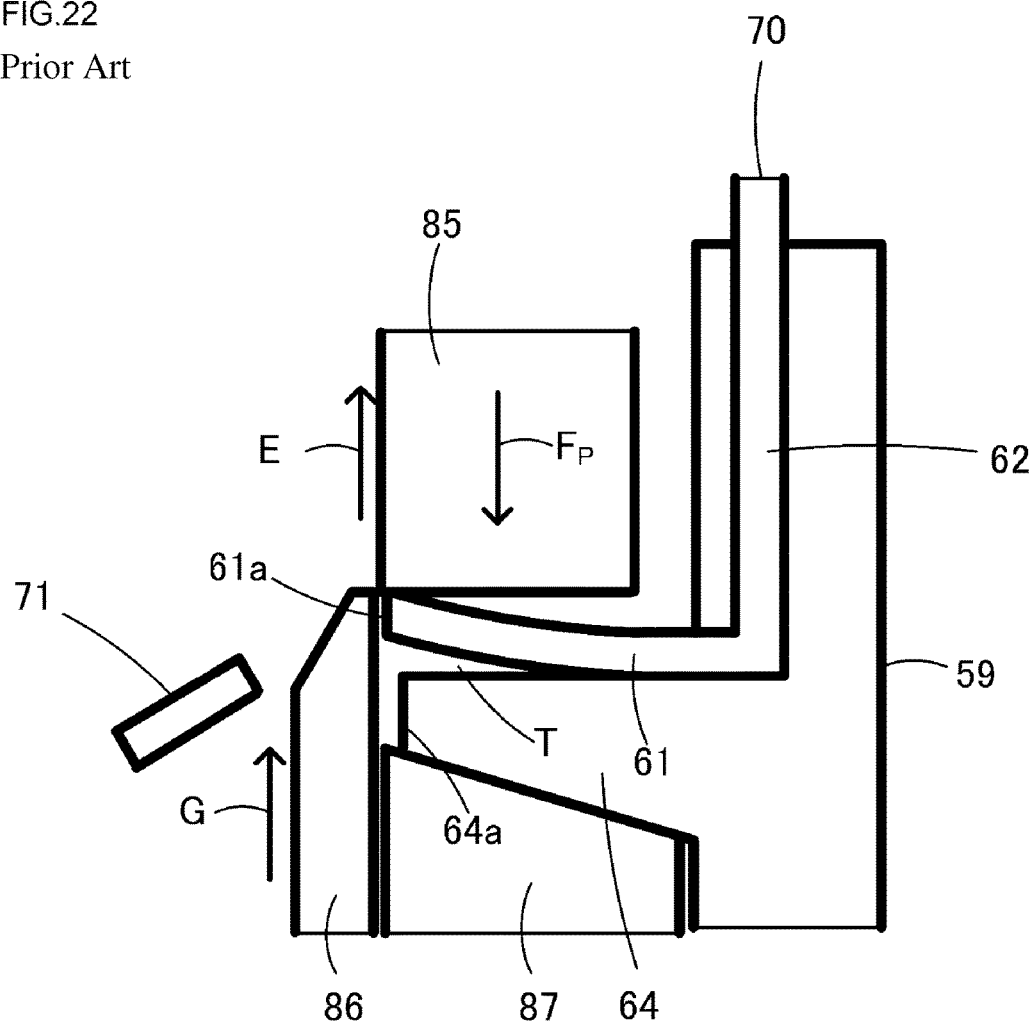
FIG. 22 is an illustration when a tie bar cutting is carried out in a state wherein a pressurizing force from an upper support body is insufficient.
Figure 23:
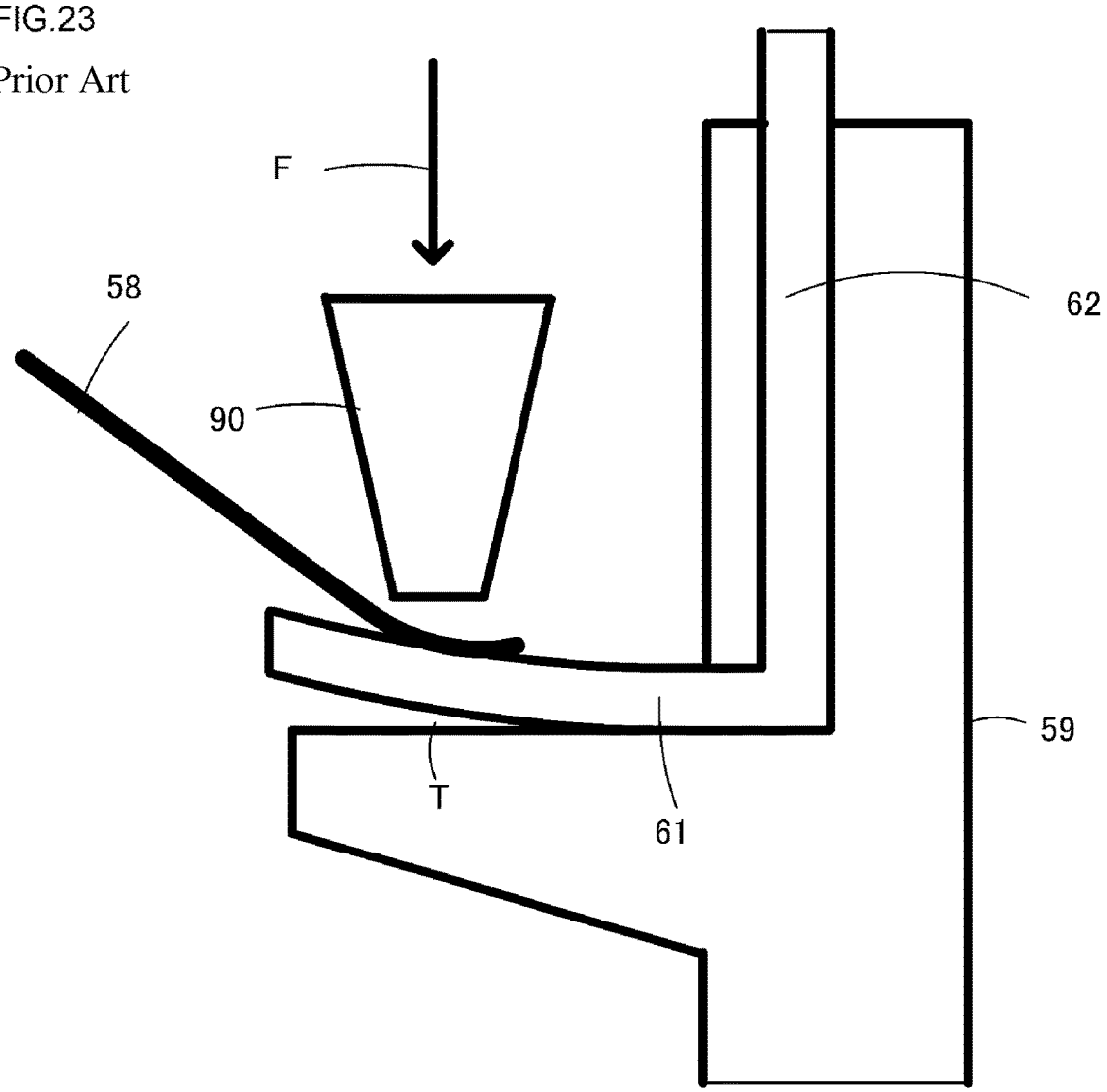
FIG. 23 is an illustration when wire bonding onto an internal terminal is carried out in the state shown in FIG. 22.

Also, as the width W of the resin fixed portion 18 is increased, t the more cutting force is required. However, when the width W is too large, the electrical resistance of the internal terminal increases. Also, as the length K of a portion in which the wire bonding is carried out is reduced, the width W of the resin fixed portion 18 is preferably 0.5 mm to 3 mm, and more preferably 1 mm to 2 mm. In order to secure a region in which the wire bonding can be carried out, it is good when the width W of the resin fixed portion 18 is in the range of one-third or less of the length of the internal terminal 11. When the length of the internal terminal 11 is 4 mm, and the distance Q between the leading end 11*a* of the internal terminal 11 and an inner wall 13a of the vertical resin portion 13 is in the range of 3 mm, the length K of the place in which the wire bonding is carried out is in the range of 2 mm (Q−W=3 mm−1 mm), and a bonding area is thus secured. Further, by forming the resin fixed portion 18, lifting upward of the internal terminal 11 by the cutting blade 36 is prevented, and the generation of a gap under the internal terminal 11 (a gap corresponding to the gap T of FIG. 22) can be restricted.

Figure 21A:
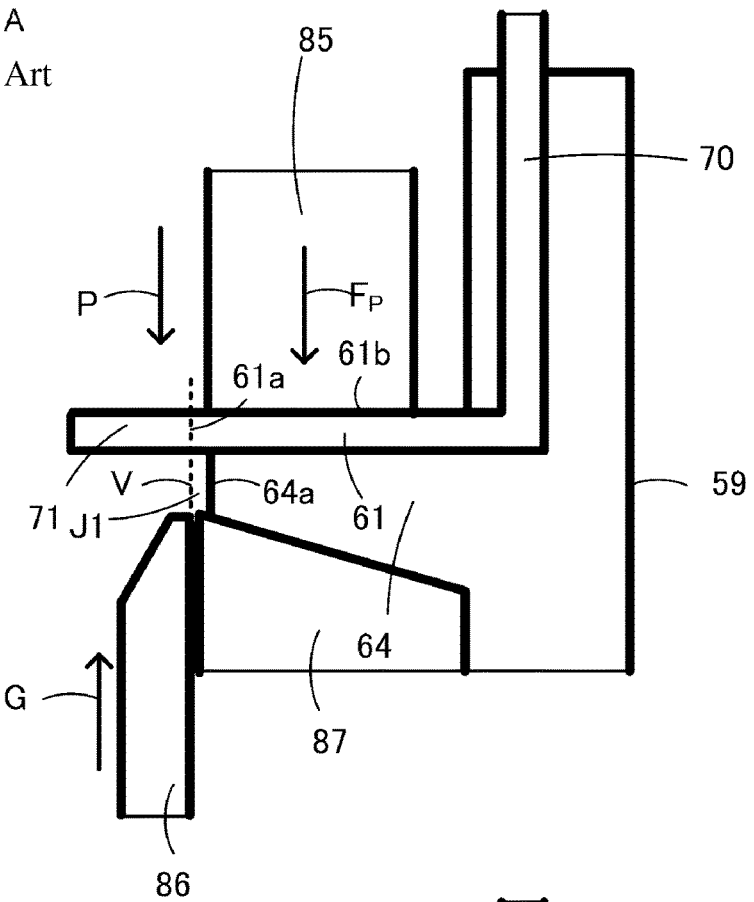
FIGS. 21A and 21B are illustrations showing a conventional terminal coupling portion cut off from a lead frame.
Figure 21B:
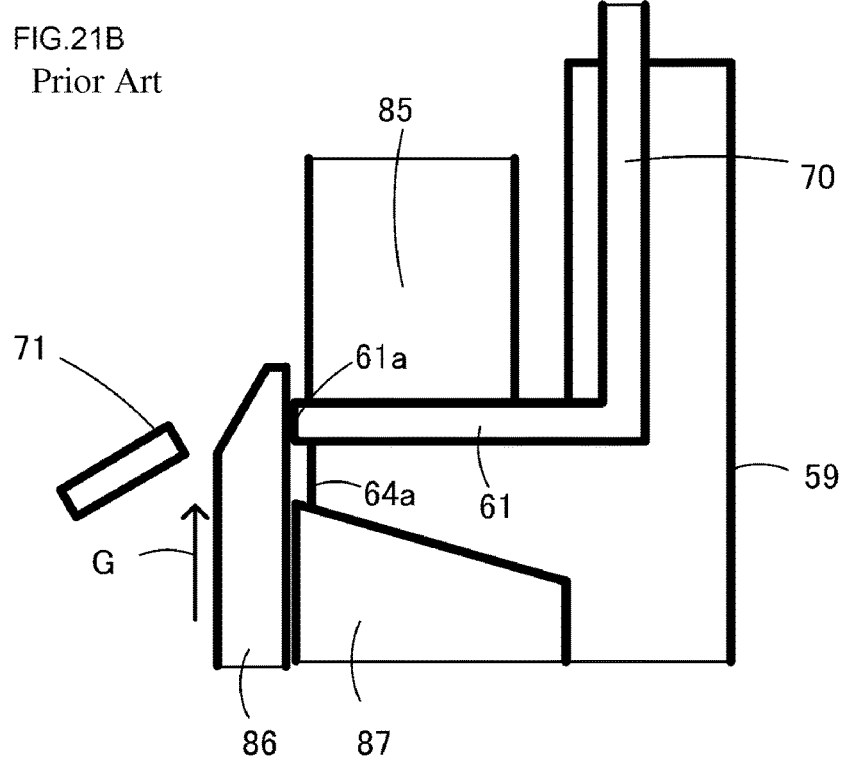

Also, as the thickness R2 of the internal terminal 11 is small at the tie bar cutting place, cutting time is short, and there is a decrease at the time for which the force of the cutting blade 36 that attempts to lift up the internal terminal 11 is applied. Therefore, the generation of a gap under the internal terminal 11 is restricted further when comparing to the case of the thick internal terminal 11 in which no L-form stepped portion 17 is formed (for example, refer to FIGS. 21A and 21B).

Figure 13A:
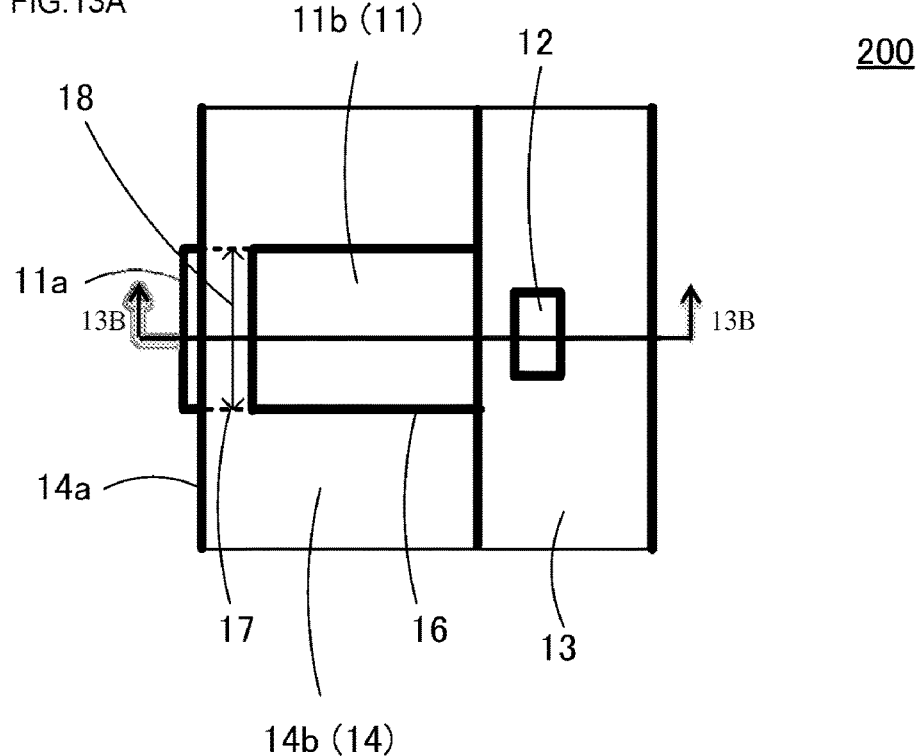
Figure 13B:
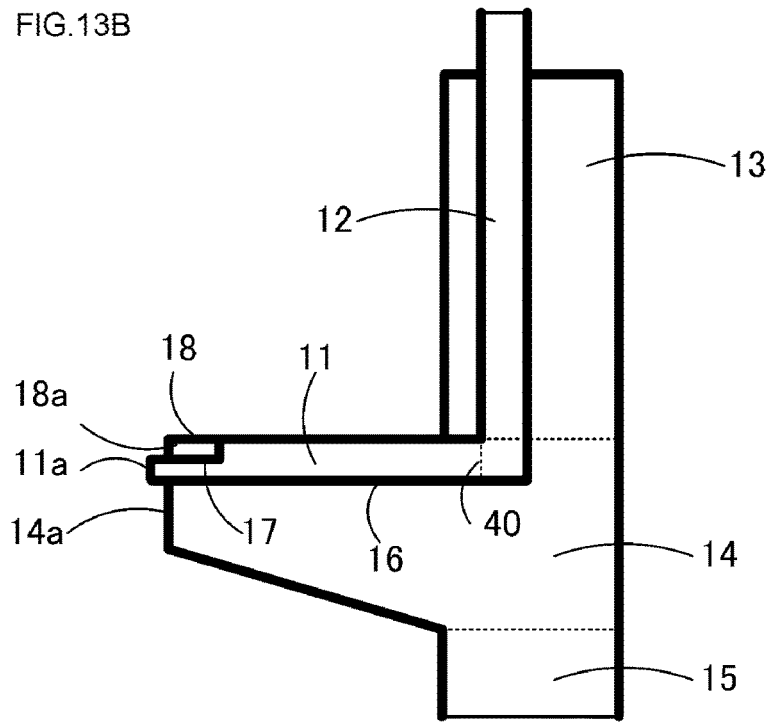

FIGS. 13A and 13B are diagrams of the second semiconductor device 200 according to the invention. FIG. 13A is a top view. FIG. 13B is a sectional view cut along a line 13B-13B of FIG. 13A. FIGS. 13A and 13B are diagrams corresponding to FIGS. 12A to 12C.

A difference from the semiconductor device 100 shown in FIGS. 11A and 11B, and 12A to 12C, is that the resin fixed portion 18 is formed partly along the internal terminal 11 in the L-form stepped portion 17, and the vicinity of the leading end 11a is exposed. The side wall 18a of the resin fixed portion 18 may coincide with the leading end 14a of the horizontal resin portion 14. The tie bar cutting is carried out in a thin place on the internal terminal 11 distanced from the resin fixed portion 18. In this case, only the internal terminal 11 is cut, so that the cutting time is short, and the generation of a gap is restricted. The length by which the internal terminal 11 is exposed from the leading end 11a of the internal terminal 11 to the side wall 18a of the resin fixed portion 18 is, the shorter the better, preferably 0.1 mm to 1 mm. More preferably still, the length is 0.1 mm to 0.5 mm.

FIGS. 14A and 14B are diagrams of the third semiconductor device 300 according to the invention. FIG. 14A is a top view. FIG. 14B is a sectional view cut along a line 14B-14B of FIG. 14A. FIGS. 14A and 14B are diagrams corresponding to FIGS. 12A to 12C.

A difference from the semiconductor device 100 shown in FIGS. 11A and 11B, and 12A to 12C, is that the depressed portion 22 is formed in a place at a distance S to the connecting portion 40 side from the leading end 11 of the internal terminal 11, and the depressed portion 22 is filled with resin to form the resin fixed portion 18. The sectional form of the depressed portion 22 in the longitudinal direction of the internal terminal 11 is quadrilateral. Also, it is good when a width U of the resin fixed portion 18 is 0.5 mm to 3 mm, and more preferably 1 mm to 2 mm. Also, the distance S from the leading end 11a to 22a of the depressed portion 22 is preferably 0.1 mm to 2 mm, and more preferably 0.1 mm to 1 mm. Also, in order to secure a region in which the wire bonding can be carried out, it is good when a length, i.e. the width U of the resin fixed portion 18 added to the distance S, is in the range of one-third or less of the length of the internal terminal 11.

Also, in FIGS. 14A and 14B, there is also a case wherein the resin fixed portion 18 is formed by forming the resin for filling the depressed portion 22 to protrude from the surface 11b of the internal terminal 11. In this case, the greater the height of the protrusion from the surface 11b of the internal terminal 11, the more the cutting force can resist. However, when the height is too great, there are also problems such as forming an impediment to the bonding wire, or being difficult to hold down the internal terminal with the upper support body, so that a height of 0.1 mm to 5 mm is preferable, and a height of 1 mm to 2 mm is more preferable still. By forming the resin fixed portion 18 in this way, lifting upward of the internal terminal 11 by the cutting blade 36 is prevented, and the generation of a gap under the internal terminal 11 (a gap corresponding to the gap T of FIG. 22) can be restricted.

Figure 15A:
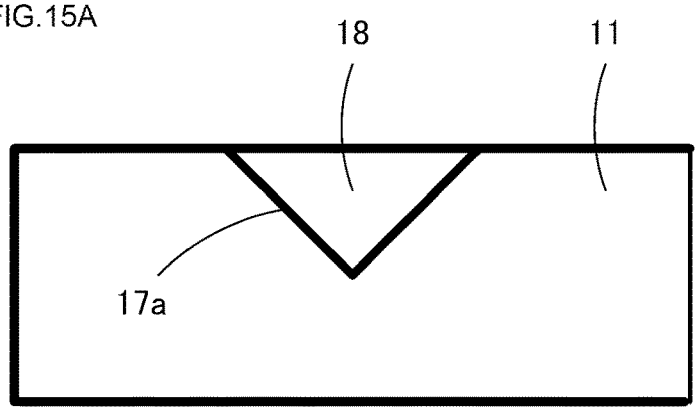
FIGS. 15A to 15C are sectional views showing modification examples of FIGS. 14A and 14B, wherein the form of a depressed portion is triangular in FIG. 15A, the form of a depressed portion is trapezoidal in FIG. 15B, and the form of a depressed portion is semi-circular in FIG. 15C.
Figure 15B:
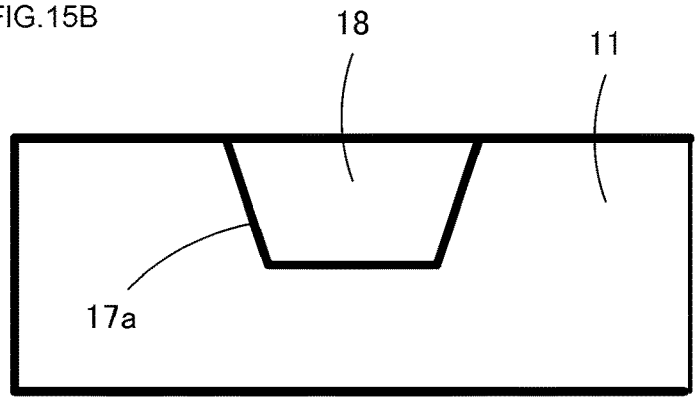
Figure 15C:
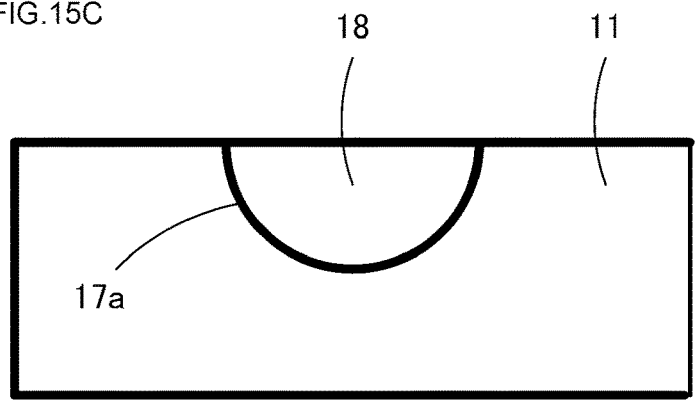

FIGS. 15A to 15C are sectional views showing modified examples of the sectional form of the resin fixed portion 18 formed in the depressed portion 22 of FIGS. 14A and 14B. FIG. 15A shows a triangular form. FIG. 15B shows a trapezoidal form. FIG. 15C shows a semi-circular form. In all cases, it is good when the tensile strength of the resin fixed portion 18 is 1 MPa or greater.

FIGS. 16A and 16B are diagrams of the fourth semiconductor device 400 according to the invention. FIG. 16A is a top view. FIG. 16B is a sectional view cut along a line 16B-16B of FIG. 16A. FIGS. 16A and 16B are diagrams corresponding to FIGS. 12A to 12C.

A difference from the semiconductor device 100 shown in FIGS. 11A and 11B, and 12A to 12C, is that the resin fixed portion 18 protrudes from the surface 11b of the internal terminal 11. The greater the height of the protrusion from the surface 11b of the internal terminal 11, it is possible to more resist the cutting force. However, when the height is too great, there are also problems such as forming an impediment to the bonding wire, or being difficult to hold down the internal terminal with the upper support body, so that a height of 0.1 mm to 5 mm is preferable, and a height of 1 mm to 2 mm is more preferable. As the thickness of the resin fixed portion 18 is greater than that at the semiconductor device 100, the force for resisting the cutting force can be greater than that in the semiconductor device 100. Consequently, the generation of a gap can be restricted. The side wall 18a of the resin fixed portion 18 and the leading end 11a of the internal terminal 11 are the tie bar cutting plane.

Also, the width W of the resin fixed portion 18 is preferably 0.5 mm to 3 mm, more preferably still 1 mm to 2 mm, and in order to secure a region in which the wire bonding can be carried out, it is good when the width W is in the range of one-third or less of the length of the internal terminal 11.

Figure 17A:
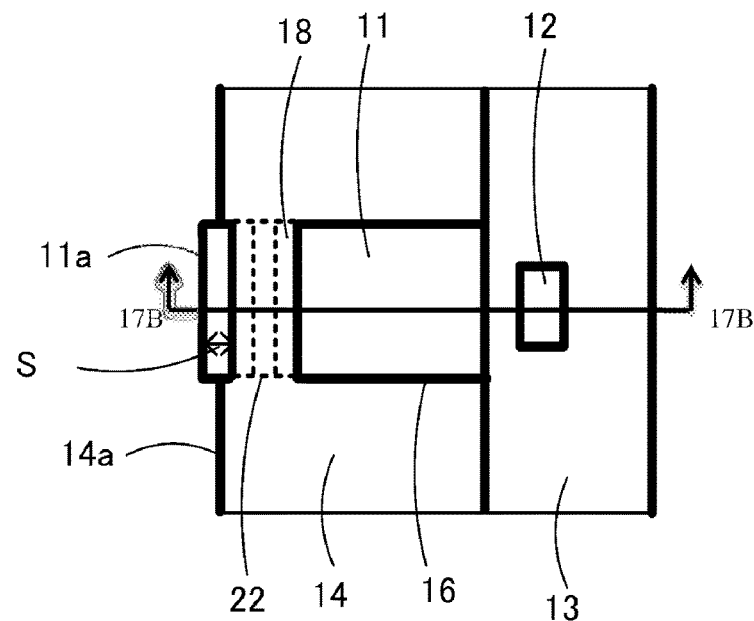
Figure 17B:
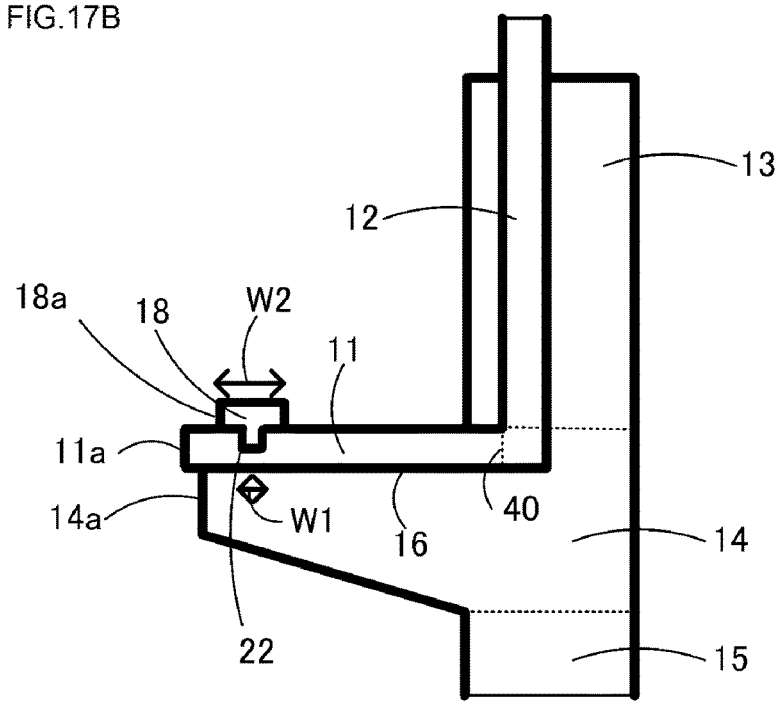

FIGS. 17A and 17B are diagrams of the fifth semiconductor device 500 according to the invention. FIG. 17A is a top view. FIG. 17B is a sectional view cut along a line 17B-17B of FIG. 17A. FIGS. 17A and 17B are diagrams corresponding to FIGS. 12A to 12C.

The resin fixed portion 18 of FIGS. 17A and 17B is provided in a place separated by the distance S to the connecting portion side from the leading end 11a of the internal terminal 11. A difference from the semiconductor device 400 shown in FIGS. 16A and 16B is that a width W2 of the surface of the resin fixed portion 18 is greater than a width W1 at a place in which the resin fixed portion 18 is buried in the internal terminal 11. As the width W2 of the protruding portion is greater than the width W1 of the depressed portion 22, the protruding portion forms a canopy. Therefore, the force holding down the internal terminal 11 increases, suppressing the force of the internal terminal 11 distorting upward, so that the generation of the gap T is suppressed. Furthermore, as W2 can be reduced in comparison with the case where W1 and W2 are the same, the strength as the internal terminal 11 can be increased. W1 is preferably 0.5 mm to 3 mm, and more preferably 1 mm to 2 mm. Also, the ratio between W2 and W1 (W2/W1) is preferably 0.2 to 0.8, and more preferably 0.4 to 0.6. Also, the distance S from the leading end 11a is preferably 0.1 mm to 2 mm, and more preferably 0.1 mm to 1 mm. Also, in order to secure a region in which the wire bonding can be carried out, it is good when a length, i.e. the width W of the resin fixed portion 18 added to the distance S, is in the range of one-third or less of the length of the internal terminal 11.

Figure 18A:
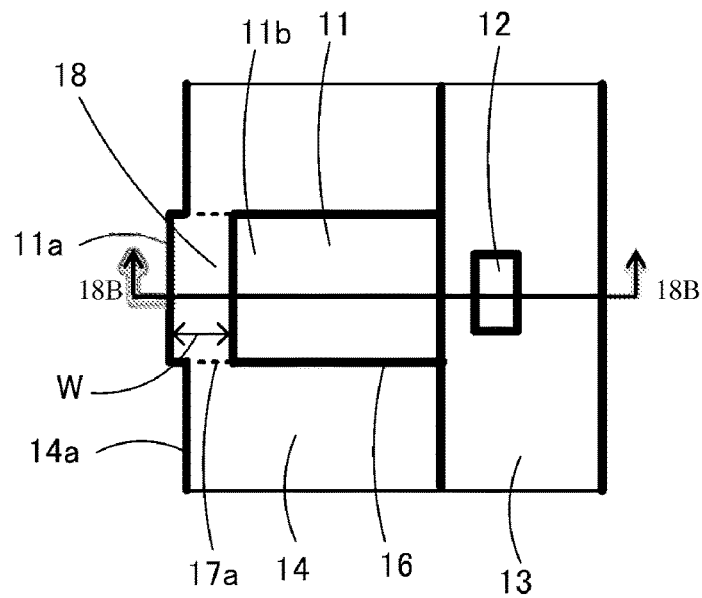
Figure 18B:
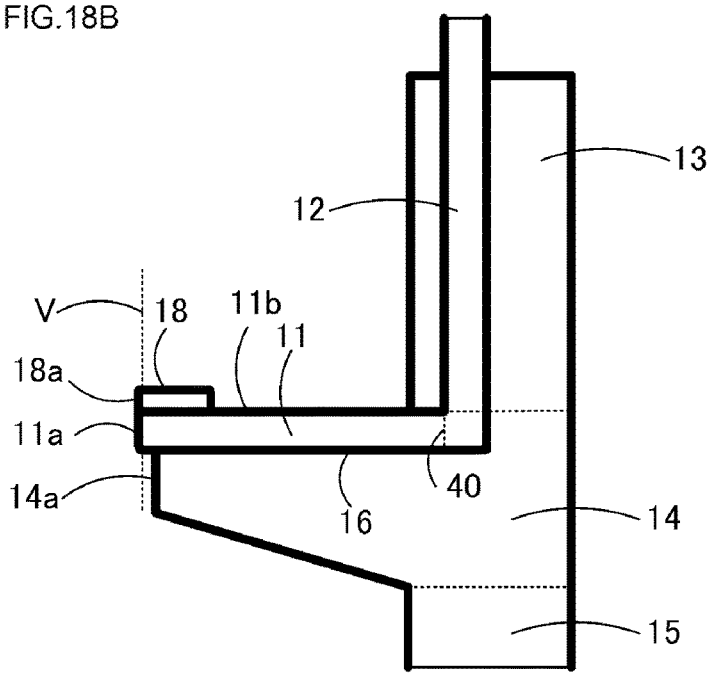

FIGS. 18A and 18B are diagrams of the sixth semiconductor device 600 according to the invention. FIG. 18A is a top view. FIG. 18B is a sectional view cut along a line 18B-18B of FIG. 18A. FIGS. 18A and 18B are diagrams corresponding to FIGS. 12A to 12C.

A difference from the semiconductor device 100 shown in FIGS. 11A and 11B, and 12A to 12C, is that no L-form stepped portion 17 is formed in the internal terminal 11, and the resin fixed portion 18 protrudes from the surface 11b of the internal terminal 11 in the vicinity of the leading end 11a of the internal terminal 11. The greater the height of the protrusion from the surface 11b of the internal terminal 11, the more the cutting force is resisted. However, when the height is too great, there are also problems such as becoming an impediment to the bonding wire, or being difficult to hold down the internal terminal with the upper support body, so that the height of 0.1 mm to 5 mm is preferable, and the height of 1 mm to 2 mm is more preferable still. Also, the width W of the resin fixed portion of FIGS. 18A and 18B is preferably 0.5 mm to 3 mm, and more preferably still 1 mm to 2 mm. As the internal terminal 11 is thick at the cutting place V, deformation is unlikely to occur, the thickness of the resin fixed portion 18 can be increased, and the generation of the gap T can thus be restricted. The leading end 11a of the internal terminal 11 and the side wall 18a of the resin fixed portion 18 are exposed and visible in the cutting plane.

Also, in order to secure a region in which wire bonding can be carried out, it is good when the resin fixed portion 18 is disposed in a place in the region of one-third or less the length of the internal terminal 11.

Figure 19A:
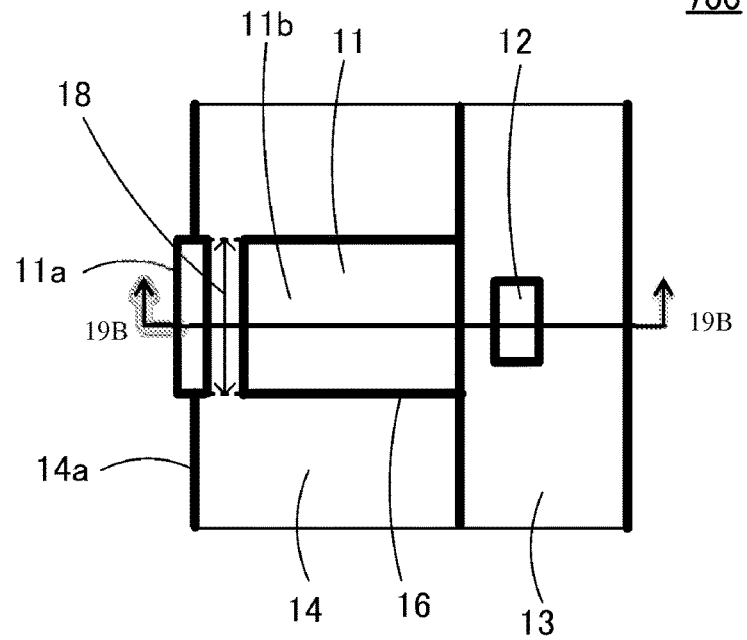
Figure 19B:
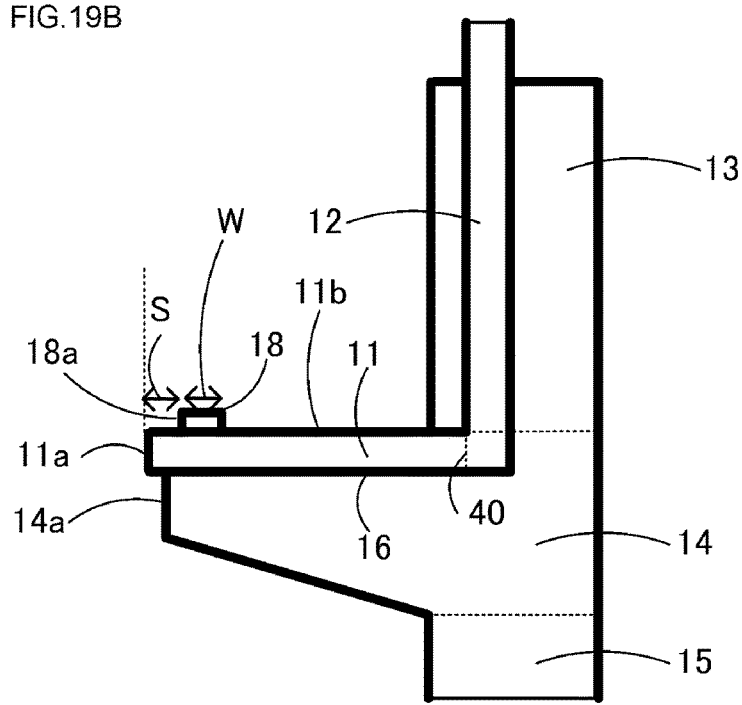
Figure 20A:
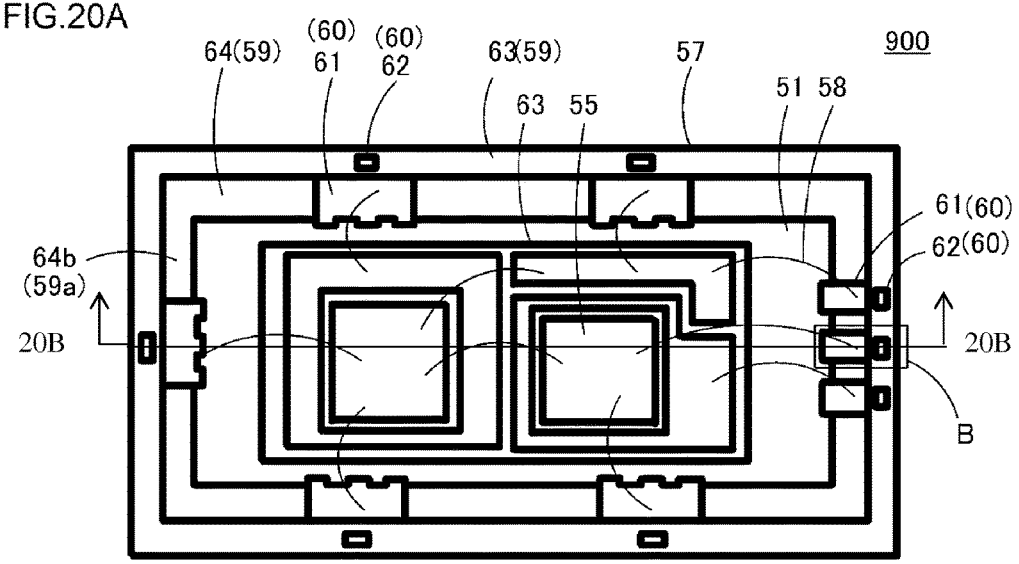
FIGS. 20A and 20B are diagrams of an existing IGBT module.
Figure 20B:
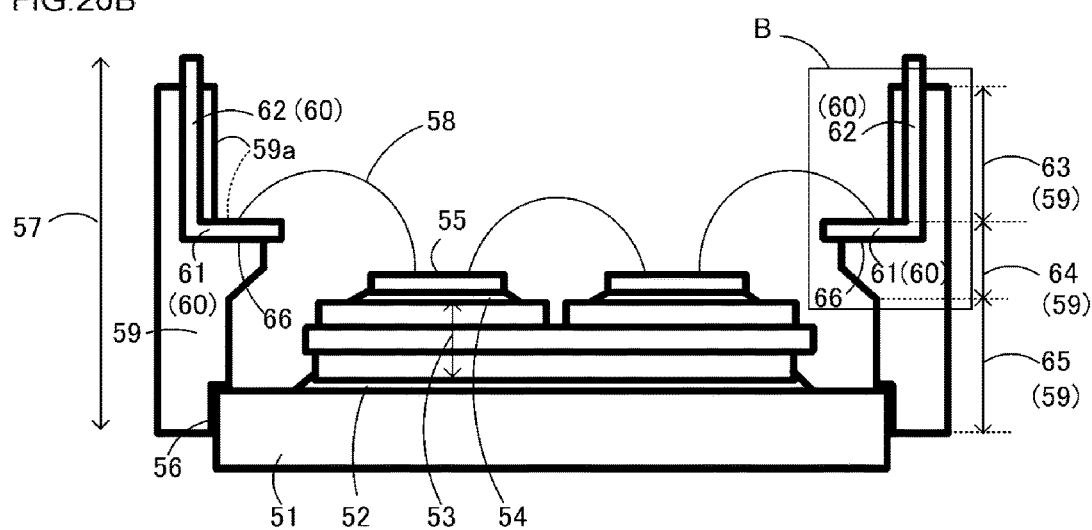

FIGS. 19A and 19B are diagrams of the seventh semiconductor device 700 according to the invention. FIG. 19A is a top view. FIG. 19B is a sectional view cut along a line 19B-19B of FIG. 19A. FIGS. 19A and 19B are diagrams corresponding to FIGS. 12A to 12C.

A difference from the semiconductor device 600 shown in FIGS. 18A and 18B is that the resin fixed portion 18 is formed in a place at a distance S away from the leading end 11a on the connecting portion 40 side of the leading end 11a of the internal terminal 11. The distance S is preferably 0.1 mm to 3 mm, and more preferably 0.1 mm to 1 mm. The greater the height of the protrusion from the surface 11b of the internal terminal 11, the more the cutting force resists. However, when the height is too great, there are also problems such as becoming an impediment to the bonding wire, or being difficult to hold down the internal terminal with the upper support body, so that the height of 0.1 mm to 5 mm is preferable, and the height of 1 mm to 2 mm is more preferable still. Also, the width W of the resin fixed portion of FIGS. 19A and 19B is preferably 0.5 mm to 3 mm, and more preferably 1 mm to 2 mm. The leading end 11a of the internal terminal 11 is exposed and visible as the cutting plane. As the internal terminal 11 is thick at the cutting place V, deformation is unlikely to occur, the thickness of the resin fixed portion 18 can be increased, and the occurrence of the gap T can thus be restricted.

What is claimed is:

1. A semiconductor device, comprising:
   a terminal case;
   an external lead-out terminal including an external terminal and an internal terminal connected to a connecting portion of the external terminal;
   an upper side vertical resin portion to which the external terminal is fixed;
   a horizontal resin portion connected to the upper side vertical resin portion and having a groove in which the internal terminal is embedded;
   a lower side vertical resin portion connected to the horizontal resin portion;
   a resin fixed portion connected to the horizontal resin portion and covering a portion of an upper surface of the internal terminal, and
   an L-form stepped portion,
   wherein a leading end surface in the longitudinal direction of the internal terminal on a side opposite to that of the connecting portion is an exposed cutting plane,
   the L-form stepped portion is disposed from the leading end surface of the internal terminal toward the connecting portion,
   the resin fixed portion is disposed in the L-form stepped portion, and
   an exposed upper surface of the internal terminal and an upper surface of the resin fixed portion are connected evenly or the upper surface of the resin fixed portion protrudes from the exposed upper surface of the internal terminal.

2. The semiconductor device according to claim 1, further comprising a depressed portion disposed in a lateral direction of the internal terminal,
   wherein the resin fixed portion is disposed in the depressed portion, and the upper surface of the resin fixed portion protrudes from the exposed upper surface of the internal terminal.

3. The semiconductor device according to claim 1, wherein the internal terminal has the exposed upper surface, and the resin fixed portion is disposed on the internal terminal upper surface.

4. A semiconductor device, comprising:
   a terminal case;
   an external lead-out terminal including an external terminal and an internal terminal connected to a connecting portion of the external terminal;
   an upper side vertical resin portion to which the external terminal is fixed;
   a horizontal resin portion connected to the upper side vertical resin portion and having a groove in which the internal terminal is embedded;
   a lower side vertical resin portion connected to the horizontal resin portion;
   a resin fixed portion connected to the horizontal resin portion and covering a portion of an upper surface of the internal terminal, and
   a depressed portion disposed in a lateral direction of the internal terminal,
   wherein a leading end surface in the longitudinal direction of the internal terminal on a side opposite to that of the connecting portion is an exposed cutting plane, and
   the resin fixed portion is disposed in the depressed portion, and an exposed upper surface of the internal terminal and an upper surface of the resin fixed portion are connected evenly.

5. A semiconductor device manufacturing method, wherein a semiconductor device comprises:
   a terminal case;

an external lead-out terminal including an external terminal and an internal terminal connected to a connecting portion of the external terminal;
an upper side vertical resin portion to which the external terminal is fixed;
a horizontal resin portion connected to the upper side vertical resin portion and having a groove in which the internal terminal is embedded;
a lower side vertical resin portion connected to the horizontal resin portion; and
a resin fixed portion connected to the horizontal resin portion and covering a portion of an upper surface of the internal terminal,
wherein a leading end surface in the longitudinal direction of the internal terminal on a side opposite to that of the connecting portion is an exposed cutting plane,
the semiconductor manufacturing method comprising:
a step of disposing a lead frame having a terminal coupling portion connected to the internal terminal of the external lead-out terminal in a die;
a step of injecting a liquid resin into the die and hardening the liquid resin, thereby forming a lead frame structural body having the resin fixed portion;
a step of removing the lead frame structural body from the die; and
a step of cutting the terminal coupling portion, thereby forming a terminal case,
wherein a depressed portion continuous with the internal terminal and terminal coupling portion is formed, the depressed portion is filled with a resin that becomes the resin fixed portion, and the resin filling the depressed portion and the lead frame under the depressed portion are cut simultaneously.

6. A semiconductor device manufacturing method, wherein a semiconductor device comprises:
a terminal case;
an external lead-out terminal including an external terminal and an internal terminal connected to a connecting portion of the external terminal;
an upper side vertical resin portion to which the external terminal is fixed;
a horizontal resin portion connected to the upper side vertical resin portion and having a groove in which the internal terminal is embedded;
a lower side vertical resin portion connected to the horizontal resin portion; and
a resin fixed portion connected to the horizontal resin portion and covering a portion of an upper surface of the internal terminal,
wherein a leading end surface in the longitudinal direction of the internal terminal on a side opposite to that of the connecting portion is an exposed cutting plane,
the semiconductor manufacturing method comprising:
a step of disposing a lead frame having a terminal coupling portion connected to the internal terminal of the external lead-out terminal in a die;
a step of injecting a liquid resin into the die and hardening the liquid resin, thereby forming a lead frame structural body having the resin fixed portion;
a step of removing the lead frame structural body from the die; and
a step of cutting the terminal coupling portion, thereby forming a terminal case,
wherein a depressed portion is formed in a lateral direction of the internal terminal, the depressed portion is filled with a resin that becomes the resin fixed portion, and the lead frame on the terminal coupling portion side, in which the depressed portion is not formed, is cut.

7. A semiconductor device manufacturing method, wherein a semiconductor device comprises:
a terminal case;
an external lead-out terminal including an external terminal and an internal terminal connected to a connecting portion of the external terminal;
an upper side vertical resin portion to which the external terminal is fixed;
a horizontal resin portion connected to the upper side vertical resin portion and having a groove in which the internal terminal is embedded;
a lower side vertical resin portion connected to the horizontal resin portion; and
a resin fixed portion connected to the horizontal resin portion and covering a portion of an upper surface of the internal terminal,
wherein a leading end surface in the longitudinal direction of the internal terminal on a side opposite to that of the connecting portion is an exposed cutting plane,
the semiconductor manufacturing method comprising:
a step of disposing a lead frame having a terminal coupling portion connected to the internal terminal of the external lead-out terminal in a die;
a step of injecting a liquid resin into the die and hardening the liquid resin, thereby forming a lead frame structural body having the resin fixed portion;
a step of removing the lead frame structural body from the die; and
a step of cutting the terminal coupling portion, thereby forming a terminal case,
wherein a resin that becomes the resin fixed portion is formed on an upper surface of a flat place continuous with the internal terminal and terminal coupling portion, and the resin and the lead frame under the resin are cut simultaneously.

8. A semiconductor device manufacturing method, wherein a semiconductor device comprises:
a terminal case;
an external lead-out terminal including an external terminal and an internal terminal connected to a connecting portion of the external terminal;
an upper side vertical resin portion to which the external terminal is fixed;
a horizontal resin portion connected to the upper side vertical resin portion and having a groove in which the internal terminal is embedded;
a lower side vertical resin portion connected to the horizontal resin portion; and
a resin fixed portion connected to the horizontal resin portion and covering a portion of an upper surface of the internal terminal,
wherein a leading end surface in the longitudinal direction of the internal terminal on a side opposite to that of the connecting portion is an exposed cutting plane,
the semiconductor manufacturing method comprising:
a step of disposing a lead frame having a terminal coupling portion connected to the internal terminal of the external lead-out terminal in a die;
a step of injecting a liquid resin into the die and hardening the liquid resin, thereby forming a lead frame structural body having the resin fixed portion;
a step of removing the lead frame structural body from the die; and a step of cutting the terminal coupling portion, thereby forming a terminal case,
wherein a resin that becomes the resin fixed portion is formed in a lateral direction on the flat upper surface of the internal terminal, and the lead frame on the terminal coupling portion side, on which the resin is not formed, is cut.

* * * * *